(12) United States Patent
Arimoto et al.

(10) Patent No.: US 6,483,139 B1
(45) Date of Patent: Nov. 19, 2002

(54) SEMICONDUCTOR MEMORY DEVICE FORMED ON SEMICONDUCTOR SUBSTRATE

(75) Inventors: Kazutami Arimoto, Hyogo (JP); Hiroki Shimano, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/983,294

(22) Filed: Oct. 23, 2001

(30) Foreign Application Priority Data

Jul. 5, 2001 (JP) ........................................ 2001-204723

(51) Int. Cl.[7] ............................................. H01L 29/76
(52) U.S. Cl. ........................ 257/296; 257/295; 257/296; 257/297; 257/300; 257/301; 257/302; 257/303; 257/304; 257/306; 257/308; 257/311; 257/327; 257/329; 257/330; 257/331; 257/332; 257/333; 257/334; 365/63; 365/51; 365/230.03; 365/190; 365/149
(58) Field of Search .................. 257/296, 301, 257/300, 306, 308, 379, 295, 550, 903, 904, 71, 303, 304, 311, 327, 329, 330–332, 334, 297; 438/253, 396, 256, 399; 365/63, 230.03, 51, 190, 149

(56) References Cited

U.S. PATENT DOCUMENTS

| | | | | |
|---|---|---|---|---|
| 5,502,320 A | * | 3/1996 | Yamada | 257/302 |
| 5,973,343 A | * | 10/1999 | Takasishi | 257/296 |
| 6,143,600 A | * | 11/2000 | Takaishi | 438/253 |
| 6,307,251 B1 | * | 10/2001 | Sekikawa et al. | 257/532 |
| 6,370,054 B1 | * | 4/2002 | Fujisawa et al. | 365/63 |
| 2001/0052610 A1 | * | 12/2001 | Leung et al. | 257/296 |
| 2002/0028550 A1 | * | 3/2002 | Morihara et al. | 438/241 |
| 2002/0053691 A1 | * | 5/2002 | Leung et al. | 257/296 |

FOREIGN PATENT DOCUMENTS

| | | |
|---|---|---|
| JP | 4-214291 | 8/1992 |
| JP | 10-247385 | 9/1998 |

* cited by examiner

*Primary Examiner*—Nathan J. Flynn
*Assistant Examiner*—Fazli Erdem
(74) *Attorney, Agent, or Firm*—McDermott, Will & Emery

(57) ABSTRACT

In a memory cell contained in a memory circuit portion of a system LSI, a gate electrode of an N-channel MOS transistor and a cell plate electrode of a capacitor are formed by the same interconnection layer. Thus, the system LSI can be produced using the CMOS logic process alone so that the system LSI including the memory circuit portion having a relatively large capacity can be produced at a low cost.

17 Claims, 22 Drawing Sheets

DATA WRITE

"L" LEVEL RESTORE

SEMICONDUCTOR MEMORY DEVICE FORMED ON SEMICONDUCTOR SUBSTRATE

BACKGROUND OF THE INVENTION

1. Field of the Invention

The present invention relates to a semiconductor memory device, and more specifically, to a semiconductor memory device formed on a semiconductor substrate.

2. Description of the Background Art

In recent years, as a result of the progress made in achieving in higher integration of a dynamic random access memory (hereinafter referred to as a DRAM), a capacitor of a memory cell is given a complex three-dimensional structure. In order to mount such a DRAM onto a system LSI, in addition to a usual CMOS logic process, a process step for forming a capacitor of a memory cell of the DRAM and a planarizing step for reducing a step between a peripheral circuit portion and the capacitor having the three-dimensional structure are required. Thus, when the DRAM is mounted on a system LSI, there was a problem of a significant increase in the number of the process steps which led to an increase in the chip cost.

On the other hand, a memory cell of a static random access memory (hereinafter referred to as an SRAM) does not include a capacitor so that it can be formed by the CMOS logic process alone. Thus, the above problem that occurs when mounting the DRAM onto the system LSI is solved if the SRAM is mounted onto the system LSI.

The SRAM, however, involves the following problems. In the DRAM, greater reduction in the size of a memory cell is being effected along with the progress in the microfabrication technology, and according to a 0.18 $\mu$m DRAM process, for instance, a memory cell of 0.3 $\mu m^2$ is realized. On the other hand, in the SRAM, a memory cell is formed by two P-channel MOS transistors and four N-channel MOS transistors and is subject to restrictions such as the distance requirement in separating a P-type well and an N-type well so that the reduction in the size of the memory cell has not progressed as much as it has in a DRAM even with the progress made in the microfabrication technology. For instance, an SRAM memory cell employing the 0.18 $\mu$m CMOS logic process is about 7 $\mu m^2$, which is twenty times as large as or larger than a DRAM memory cell. Thus, increase in the memory capacity of the SRAM results in significant increase in the chip size so that it becomes extremely difficult to mount an SRAM whose memory capacity is 4 Mbits or greater onto the system LSI.

For these reasons, an SRAM has conventionally been used as a cache memory, a register file memory, or the like for a processor. Since the SRAM does not require the complex memory control involved in data refresh which is indispensable to a DRAM, the SRAM is also used as a main memory in portable electronic equipment and the like.

The features of the portable electronic equipment, however, are being significantly improved as such equipment now handles dynamic images so that a larger capacity memory is being required.

SUMMARY OF THE INVENTION

Thus, the main object of the present invention is to provide a large-capacity semiconductor memory device at a low cost.

A semiconductor memory device according to the present invention includes a memory cell having an MOS transistor and a capacitor connected in series for storing a data signal, wherein the MOS transistor includes a gate insulating film formed on a surface of a semiconductor substrate, a gate electrode formed on a surface of the gate insulating film, and an impurity diffusion region formed on the surface of the semiconductor substrate on either side of the gate electrode, the capacitor includes an impurity diffusion region formed on the surface of the semiconductor substrate, an insulating film formed on a surface of the impurity diffusion region, and a plate electrode formed on a surface of the insulating film for receiving a reference potential, and the gate electrode of the MOS transistor and the plate electrode of the capacitor are formed by the same interconnection layer. Thus, there is no need separately to provide interconnection layers for the electrode of the capacitor and for a storage node, and the semiconductor memory device can be produced by the CMOS logic process alone so that reduction in the chip cost can be achieved. In addition, the gate insulating film of the MOS transistor and the insulating film of the capacitor are made to have the same thickness so that the distance between the MOS transistor and the capacitor can be shortened, and the reduction in the chip size can be achieved. Moreover, a dynamic memory cell is employed so that the memory capacity can be increased when compared with the case where a static memory cell is employed.

Preferably, the semiconductor memory device is formed on the semiconductor substrate together with a logic circuit including an MOS transistor. A gate electrode of the MOS transistor of the logic circuit, the gate electrode of the MOS transistor of the memory cell, and the plate electrode of the capacitor are formed by the same interconnection layer. In this case, a system LSI including the semiconductor memory device and the logic circuit can be produced by the CMOS logic process alone.

More preferably, the MOS transistor of the memory cell is an N-channel MOS transistor, and the semiconductor memory device further includes a word line connected to a gate of the N-channel MOS transistor; first and second bit lines, one of which is connected to a source of the N-channel MOS transistor; a first P-channel MOS transistor connected between the first bit line and a first node; a second P-channel MOS transistor connected between the second bit line and a second node; and a write circuit for writing a data signal into the memory cell. The write circuit performs the steps of supplying a ground potential to gates of the first and second P-channel MOS transistors to render the first and second P-channel MOS transistors conductive, supplying a boosted potential that is higher than a power-supply potential to the word line to render the N-channel MOS transistor of the memory cell conductive, causing one of the first and second nodes to attain the power-supply potential while causing the other node to attain the ground potential according to an externally supplied write data signal, and supplying a negative potential that is lower than the ground potential to gates of the first and second P-channel MOS transistors while supplying the power-supply potential to the word line. In this case, data can be written into a memory cell without destroying the gate insulating film of the N-channel MOS transistor of the memory cell.

More preferably, an absolute value of a threshold voltage of each of the first and second P-channel MOS transistors is set to be substantially equal to a voltage of a difference between the boosted potential and the power-supply potential. In this case, the data signal can be sufficiently written into the memory cell while a voltage applied to the gate insulating film of the N-channel MOS transistor of the memory cell is limited to the power-supply voltage or to a lower voltage.

More preferably, two memory cells are provided, and one data signal is stored using two memory cells, two word lines are provided, gates of N-channel MOS transistors of the two memory cells are respectively connected to the two word lines, and sources of the N-channel MOS transistors of two memory cells are respectively connected to the first and second bit lines. In this case, the data signal can be more reliably written/read.

More preferably, two memory cells are provided, and one data signal is stored using two memory cells, gates of N-channel MOS transistors of the two memory cells are both connected to the word line, and sources of the N-channel MOS transistors of the two memory cells are respectively connected to the first and second bit lines. In this case, also, the data signal can be more reliably written/read.

More preferably, the MOS transistor of the memory cell is a P-channel MOS transistor, and the semiconductor memory device further includes a word line connected to a gate of the P-channel MOS transistor; first and second bit lines, one of which is connected to a source of the P-channel MOS transistor; a first N-channel MOS transistor connected between the first bit line and a first node; a second N-channel MOS transistor connected between the second bit line and a second node; and a write circuit for writing a data signal into the memory cell. The write circuit performs the steps of supplying a power-supply potential to gates of the first and second N-channel MOS transistors to render the first and second N-channel MOS transistors conductive, supplying a negative potential that is lower than a ground potential to the word line to render the P-channel MOS transistor of the memory cell conductive, causing one of the first and second nodes to attain the power-supply potential while causing the other node to attain the ground potential according to an externally supplied write data signal, and supplying a boosted potential that is higher than the power-supply potential to gates of the first and second N-channel MOS transistors while supplying the ground potential to the word line. In this case, data can be written into the memory cell without destroying the gate insulating film of the P-channel MOS transistor of the memory cell.

More preferably, a threshold voltage of the first and second N-channel MOS transistors is set to be substantially equal to a voltage of a difference between the ground potential and the negative potential. In this case, a data signal can be sufficiently written into the memory cell while a voltage applied to the gate insulating film of the P-channel MOS transistor of the memory cell is limited to the power-supply voltage or to a lower voltage.

More preferably, two memory cells are provided and one data signal is stored using two memory cells, and two word lines are provided. Gates of P-channel MOS transistors of the two memory cells are respectively connected to the two word lines, and sources of the P-channel MOS transistors of the two memory cells are respectively connected to the first and second bit lines. In this case, the data signal can be more reliably written/read.

More preferably, two memory cells are provided, and one data signal is stored using two memory cells, gates of P-channel MOS transistors of the two memory cells are both connected to the word line, and sources of the P-channel MOS transistors of the two memory cells are respectively connected to the first and second bit lines. In this case, the data signal can be more reliably written/read.

More preferably, an MOS transistor of the memory cell is an N-channel MOS transistor, and the semiconductor memory device further includes a word line connected to a gate of the N-channel MOS transistor; first and second bit lines, one of which is connected to a source of the N-channel MOS transistor; and a write circuit for writing a data signal into the memory cell. The write circuit performs the steps of supplying a boosted potential that is higher than a power-supply potential to the word line to render the N-channel MOS transistor of the memory cell conductive, supplying the power-supply potential to the first and second bit lines, supplying the power-supply potential to the word line, and causing one of the first and second bit lines to attain the power-supply potential while causing the other bit line to attain a ground potential. In this case, data can be written into the memory cell without destroying the gate insulating film of the N-channel MOS transistor of the memory cell.

More preferably, two memory cells are provided, and one data signal is stored using two memory cells. Two word lines are provided, gates of N-channel MOS transistors of the two memory cells are respectively connected to the two word lines, and sources of the N-channel MOS transistors of the two memory cells are respectively connected to the first and second bit lines. In this case, the data signal can be more reliably written/read.

More preferably, two memory cells are provided and one data signal is stored using two memory cells, gates of N-channel MOS transistors of the two memory cells are both connected to the word line, and sources of the N-channel MOS transistors of the two memory cells are respectively connected to the first and second bit lines. In this case, also, the data signal can be more reliably written/read.

More preferably, an MOS transistor of the memory cell is a P-channel MOS transistor, and the semiconductor memory device further includes a word line connected to a gate of the P-channel MOS transistor; first and second bit lines, one of which is connected to a source of the P-channel MOS transistor; and a write circuit for writing a data signal into the memory cell. The write circuit performs the steps of supplying a negative potential that is lower than a ground potential to the word line to render the P-channel MOS transistor of the memory cell conductive, supplying the ground potential to the first and second bit lines, supplying the ground potential to the word line, and causing one of the first and second bit lines to attain a power-supply potential while causing the other bit line to attain the ground potential. In this case, data can be written into the memory cell without destroying the gate insulating film of the P-channel MOS transistor of the memory cell.

More preferably, two memory cells are provided, and one data signal is stored using two memory cells. Two word lines are provided, gates of P-channel MOS transistors of the two memory cells are respectively connected to the two word lines, and sources of the P-channel MOS transistors of the two memory cells are respectively connected to the first and second bit lines. In this case, the data signal can be more reliably written/read.

More preferably, two memory cells are provided and one data signal is stored using two memory cells, gates of P-channel MOS transistors of the two memory cells are both connected to the word line, and sources of the P-channel MOS transistors of the two memory cells are respectively connected to the first and second bit lines. In this case, also, the data signal can be more reliably written/read.

More preferably, two memory cells are provided, and one data signal is stored using two memory cells, and an MOS transistor of one of the two memory cells is an N-channel MOS transistor, while an MOS transistor of the other memory cell is a P-channel MOS transistor, and the semiconductor memory device further includes first and second word lines respectively connected to a gate of the N-channel MOS transistor and a gate of the P-channel MOS transistor; first and second bit lines, one of which is connected to a source of the N-channel MOS transistor and a source of the P-channel MOS transistor; and a write circuit for writing a data signal into the two memory cells. The write circuit performs the steps of supplying a power-supply potential and a ground potential respectively to first and second word lines to render conductive the N-channel MOS transistor and the P-channel MOS transistor, and causing one of the first and second bit lines to attain the power-supply potential while causing the other bit line to attain the ground potential according to an externally supplied write data signal. In this case, data can be written into the memory cells without destroying the gate insulating films of the MOS transistors of the memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
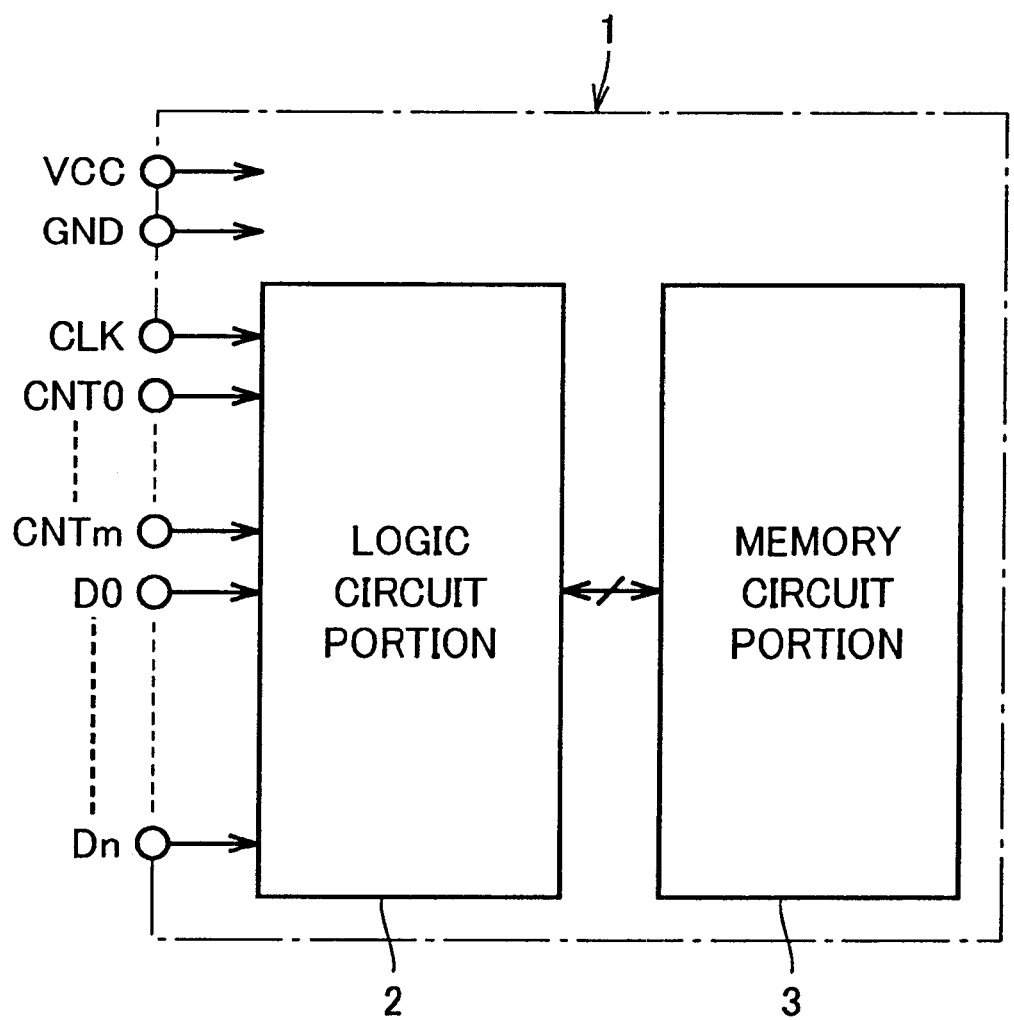
FIG. 1 is a block diagram representing an arrangement of a system LSI according to a first embodiment of the present invention.

FIG. 1 is a block diagram representing an arrangement of a system LSI 1 according to the first embodiment of the present invention. In FIG. 1, system LSI 1 includes a logic circuit portion 2 and a memory circuit portion 3 formed on one silicon substrate.

Logic circuit portion 2 operates in synchronization with an external clock signal CLK and performs a prescribed operation according to external control signals CNT0 to CNTm and external data signals D0 to Dn (m and n are integers greater than or equal to 0). Memory circuit portion 3 is controlled by logic circuit portion 2, and stores data supplied from logic circuit portion 2 and supplies read data to logic circuit portion 2.

Figure 2:
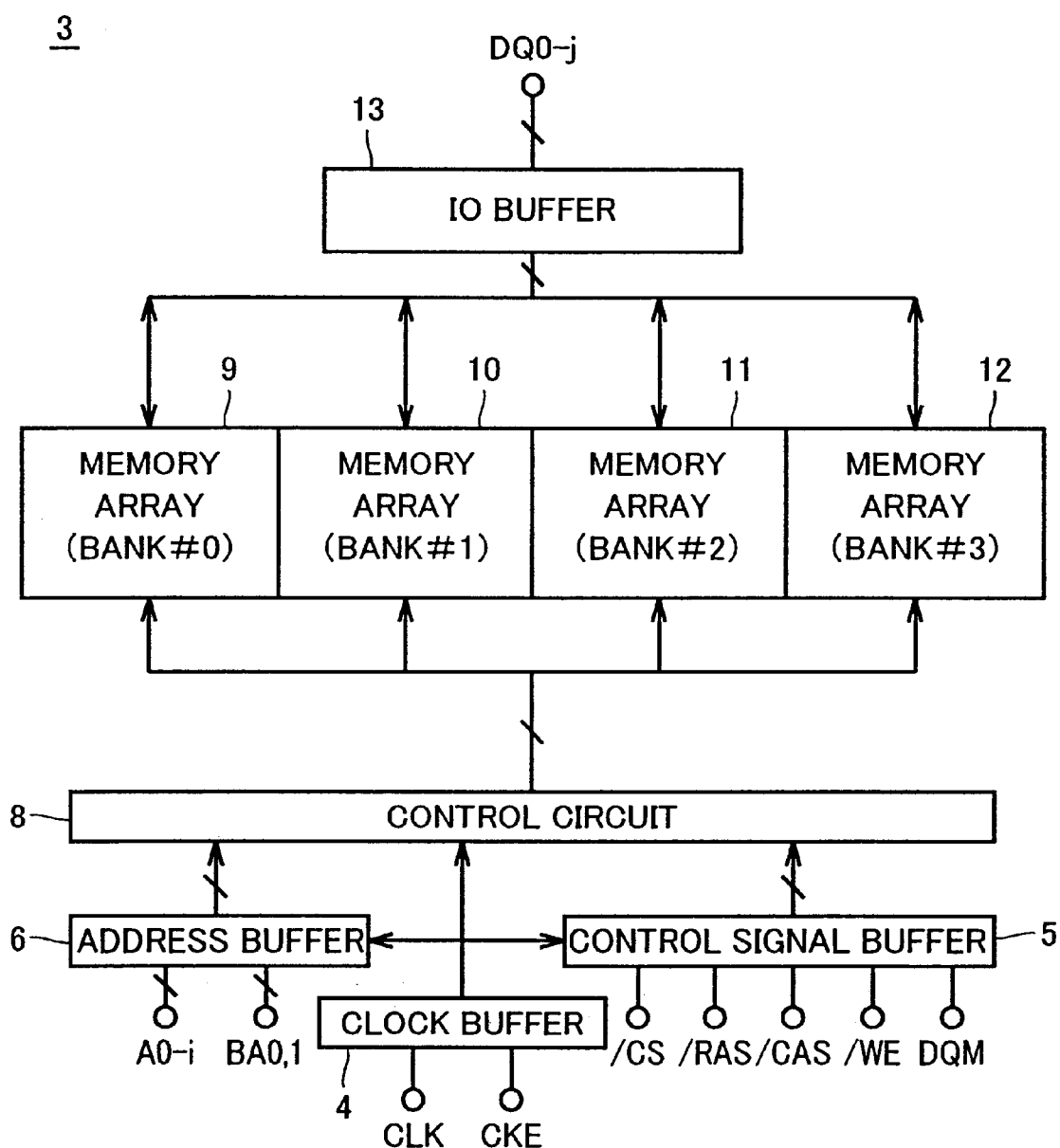
FIG. 2 is a block diagram representing an arrangement of a memory circuit portion shown in FIG. 1.

FIG. 2 is a block diagram representing an arrangement of memory circuit portion 3 shown in FIG. 1. In FIG. 2, memory circuit portion 3 is formed by a synchronous DRAM and includes a clock buffer 4, a control signal buffer 5, an address buffer 6, a control circuit 8, four memory arrays 9 to 12 (banks #0 to #3), and an 10 buffer 13.

Clock buffer 4 is activated by a control signal CKE from logic circuit portion 2, and transmits external clock signal CLK to control signal buffer 5, address buffer 6, and control circuit 8. Control signal buffer 5 latches control signals /CS, /RAS, /CAS, /WE, DQM from logic circuit portion 2 and supplies the latched control signals to control circuit 8 in synchronization with external clock signal CLK from clock buffer 4. Address buffer 6 latches address signals A0 to Ai (i is an integer greater than or equal to 0) and bank selecting signals BA0, BA1 from logic circuit portion 2 and supplies the latched signals to control circuit 8 in synchronization with external clock signal CLK from clock buffer 4.

Each of memory arrays 9 to 12 includes a plurality of memory cells which are arranged in a matrix of rows and columns and each of which stores one bit of data. The plurality of memory cells are divided into groups of j+1 memory cells (j is an integer greater than or equal to 0) in advance.

Control circuit 8 generates various internal signals according to signals from clock buffer 4, control signal buffer 5 and address buffer 6 and controls the entire memory circuit portion 3. During a write operation and during a read operation, control circuit 8 selects one of four memory arrays 9 to 12 according to bank selecting signals BA0, BA1, and selects j+1 memory cells from the selected memory array according to address signals A0 to Ai. The selected j+1 memory cells are activated and coupled to IO buffer 13.

IO buffer 13 supplies externally provided data D0 to Dj to the selected j+1 memory cells during the write operation, and outputs to the outside read data Q0 to Qj of j+1 memory cells during the read operation.

Figure 3:
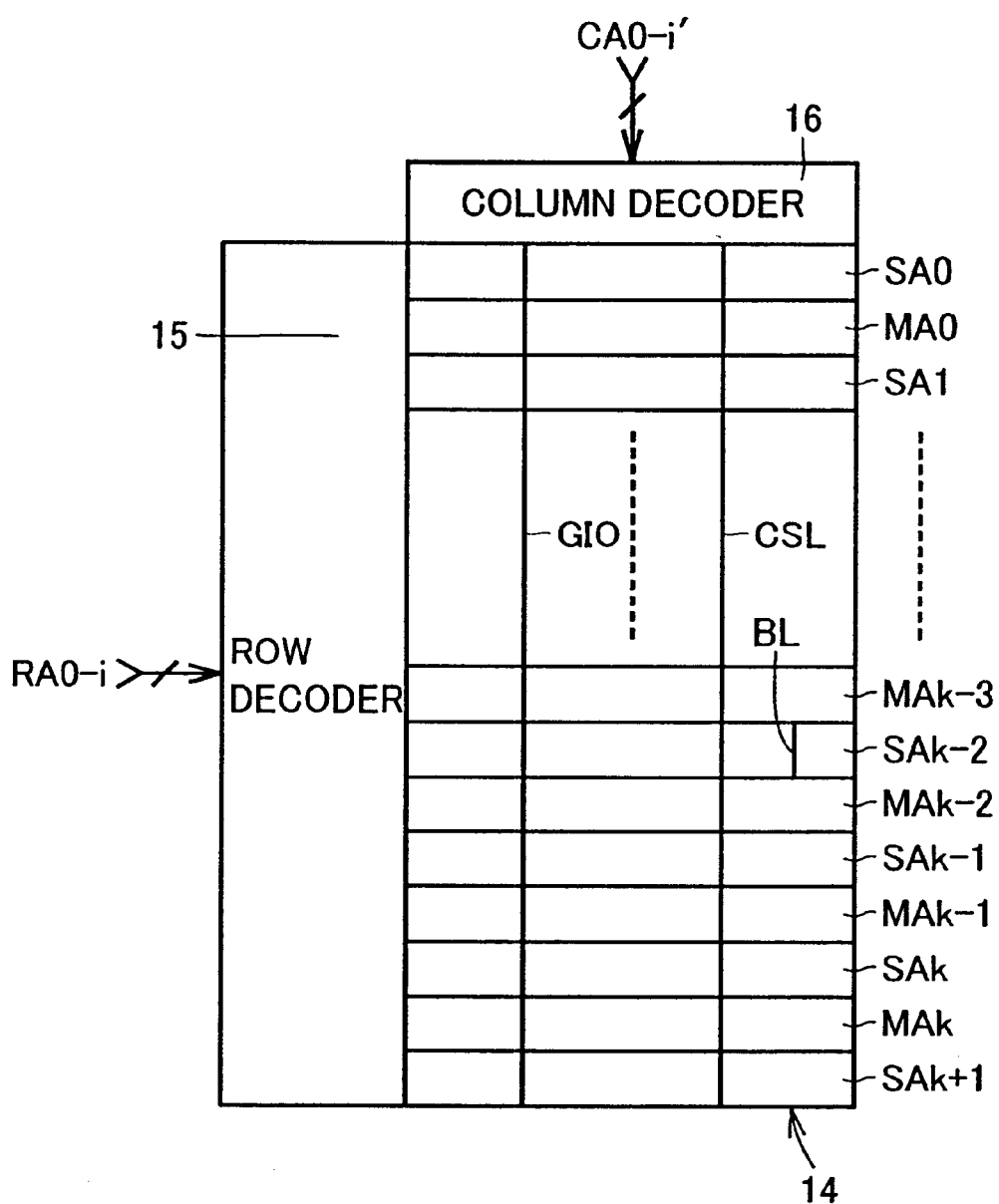
FIG. 3 is a block diagram representing an arrangement of a memory array and a portion related to the memory array shown in FIG. 2.

FIG. 3 is a block diagram representing an arrangement of memory array 9 and a portion related to memory array 9 shown in FIG. 2. In FIG. 3, memory array 9 is divided into a plurality of memory array blocks MA0 to MAk (k is an integer greater than or equal to 0), and a plurality of sense amplifier bands SA0 to SAk+1 are disposed on either side of and between the plurality of memory array blocks MA0 to MAk. Memory array blocks MA0 to MAk and sense amplifier bands SA0 to SAk+1 form a rectangular memory mat 14.

Figure 4:
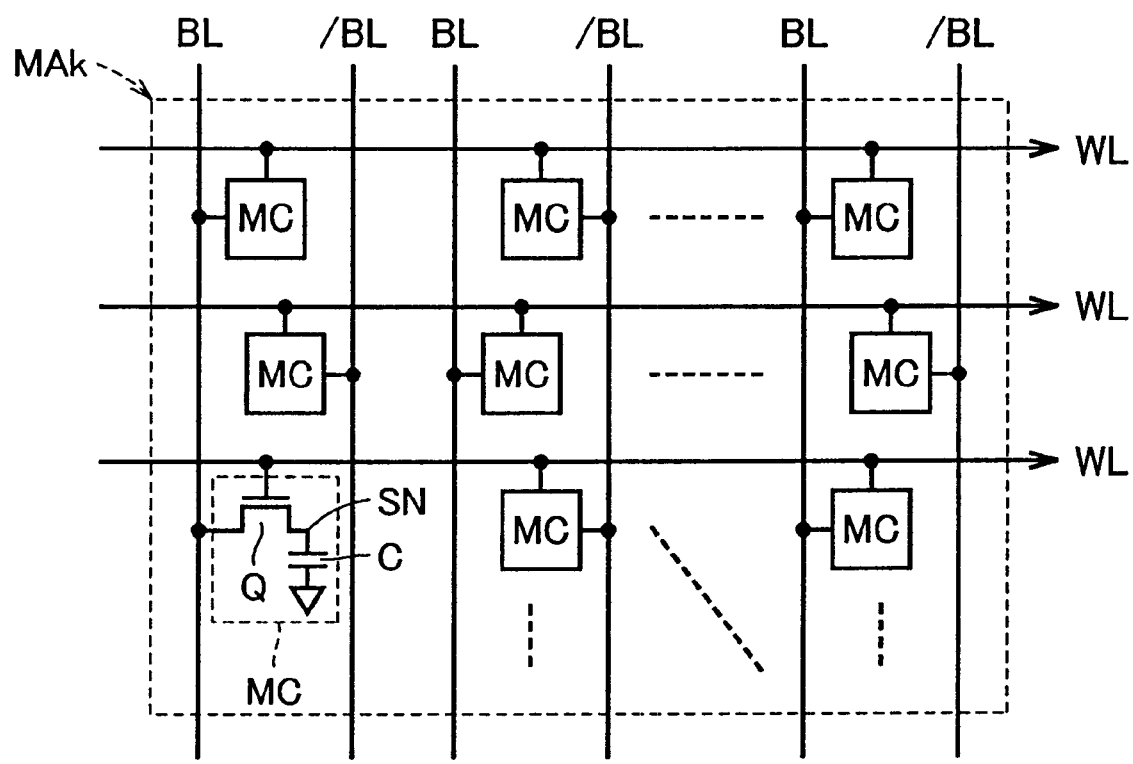
FIG. 4 is a circuit block diagram representing an arrangement of a memory array block shown in FIG. 3.

As shown in FIG. 4, a memory array block MAk includes a plurality of memory cells MC arranged in a matrix of rows and columns, a word line WL provided corresponding to each row, and a bit line pair BL, /BL provided corresponding to each column. A memory cell MC is disposed at one of two points of intersection where two bit lines BL, /BL cross one word line WL.

Each memory cell MC includes an accessing N-channel MOS transistor Q and a capacitor C for storing information. N-channel MOS transistor Q and capacitor C are connected in series between a corresponding bit line BL or /BL and a line of a cell potential VCP, and a gate of N-channel MOS transistor Q is connected to a corresponding word line WL. A node between N-channel MOS transistor Q and capacitor C is referred to as a storage node SN.

Figure 5:
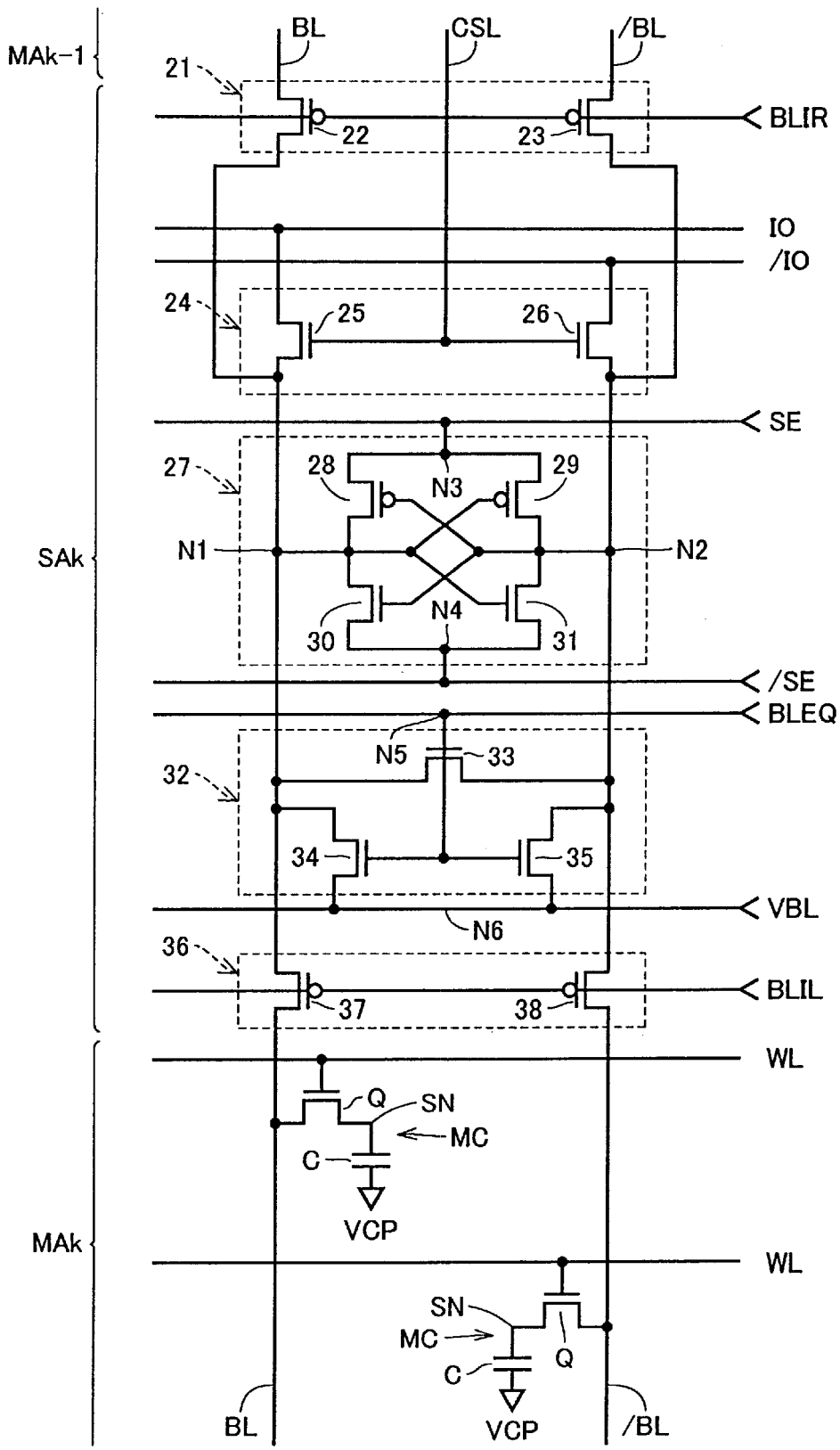
FIG. 5 is a circuit diagram representing the main portion of a sense amplifier band shown in FIG. 3.

As shown in FIG. 5, a sense amplifier band SAk includes a column select line CSL, transfer gates 21 and 36, a column select gate 24, a sense amplifier 27, and an equalizer 32 provided corresponding to each odd number column of memory array block MAk. Transfer gates 21 and 36, column select gate 24, sense amplifier 27, and equalizer 32 on each even number column of memory array block MAk are provided in a sense amplifier band SAk+1.

Transfer gate 21 includes P-channel MOS transistors 22 and 23. P-channel MOS transistors 22 and 23 are respectively connected between input/output nodes N1, N2 of sense amplifier 27 and corresponding bit lines BL, /BL of memory array block MAk–1, and their gates receive a block selecting signal BLIR.

Transfer gate 36 includes P-channel MOS transistors 37 and 38. P-channel MOS transistors 37 and 38 are respectively connected between input/output nodes N1, N2 and corresponding bit lines BL, /BL of memory array block MAk, and their gates receive a block selecting signal BLIL.

A circuit within sense amplifier band SAk is shared by two memory array blocks MAk–1 and MAk on either side. When memory array block MAk is selected, signal BLIR attains the logic high or the "H" level and transfer gate 21 is rendered non-conductive. When memory array block MAk–1 is selected, signal BLIL attains the "H" level and transfer gate 36 is rendered non-conductive.

Column select gate 24 includes N-channel MOS transistors 25 and 26 respectively connected between input/output nodes N1, N2 and data input/output lines IO, /IO. Gates of N-channel MOS transistors 25 and 26 are connected to column select line CSL. When column select line CSL rises to the select level or the "H" level, N-channel MOS transistors 25 and 26 are rendered conductive, and input/output nodes N1, N2, that is, bit lines BL, /BL of memory array block MAk–1 or MAk, are coupled to data input/output lines IO, /IO. Data input/output line pair IO, /IO is connected to one end of global data input/output line pair GIO, /GIO via a block selecting switch, not shown. The other end of global data input/output line pair GIO, /GIO is connected to IO buffer 13 via a preamplifier/write driver and a data bus.

Sense amplifier 27 includes P-channel MOS transistors 28, 29 respectively connected between input/output nodes N1, N2 and a node N3, and N-channel MOS transistors 30, 31 respectively connected between input/output nodes N1, N2 and a node N4. Gates of MOS transistors 28, 30 are both connected to node N2, and gates of MOS transistors 29, 31 are both connected to node N1. Nodes N3 and N4 respectively receive sense amplifier activating signals SE, /SE. Sense amplifier 27 amplifies a small potential difference between node N1 and node N2, that is, between bit lines BL, /BL of memory array block MAk–1 or MAk, to a power-supply voltage VCC in response to sense amplifier activating signals SE, /SE respectively attaining the "H" level and the logic low or "L" level.

Equalizer 32 includes an N-channel MOS transistor 33 connected between input/output nodes N1 and N2, and N-channel MOS transistors 34 and 35 respectively connected between input/output nodes N1, N2 and a node N6. Gates of N-channel MOS transistors 33 to 35 are all connected to a node N5. Node N5 receives a bit line equalize signal BLEQ and node N6 receives a bit line precharge potential VBL (=VCC/2). Equalizer 32 equalizes a potential difference between nodes N1 and N2, that is, a potential difference between bit lines BL and /BL of memory array block MAk–1 or MAk, to bit line precharge potential VBL in response to bit line equalize signal BLEQ attaining the active level or the "H" level.

Referring back to FIG. 3, a row decoder 15 is disposed along a long side of rectangular memory mat 14, and a column decoder 16 is disposed along a short side of memory mat 14. Row decoder 15 selects one (for instance, MAk) of a plurality of memory array blocks MA0 to MAk and one of a plurality of word lines WL belonging to the selected memory array block MAk and causes the selected word line WL to attain the select level or the "H" level, thereby activating the respective corresponding memory cells MC, according to row address signals RA0 to RAi (address signals A0 to Ai at the time a signal /RAS is at the "L" level).

Column decoder 16 selects one of a plurality of column select lines CSL and causes the selected column select line CSL to attain the select level or the "H" level, thereby rendering the respective corresponding column select gates 24 conductive according to column address signals CA0 to CAi' (address signals A0 to Ai' when a signal /CAS is at the "L" level). Here, i' is an integer between 0 and i.

Now, an operation of memory circuit portion 3 shown in FIGS. 2 to 5 will be described. At standby, signals BLIR, BLIL are both at the "L" level, a signal BLEQ is at the "H" level, and signals SE, /SE are both at an intermediate level (VCC/2), and bit lines BL, /BL are equalized to bit line precharge potential VBL. In addition, word line WL and column select line CSL are at the non-select level or the "L" level.

During a write mode, first, bit line equalize signal BLEQ falls to the "L" level and the equalizing operation of bit lines BL, /BL is interrupted. Then, row decoder 15 selects a memory array block (for instance, MAk) designated by row address signals RA0 to RAi, signals BLIR, BLIL respectively attain the "H" level and the "L" level, and memory array block MAk is coupled to sense amplifier bands SAk and SAk+1. In addition, row decoder 15 causes word line WL of a row corresponding to row address signals RA0 to RAi to rise to the select level or the "H" level, and an N-channel MOS transistor Q of each memory cell MC of that row is rendered conductive.

Then, column decoder 16 causes column select line CSL of a column corresponding to column address signals CA0 to CAi' to rise to the select level or the "H" level, and select gate 24 of that column is rendered conductive. A write data signal Di supplied from logic circuit portion 2 is provided to bit line pair BL, /BL of the selected column via IO buffer 13, global data input/output line pair GIO, /GIO, and data input/output line pair IO, /IO. Sense amplifier 27 causes one of bit lines BL, /BL to attain the "H" level and causes the other bit line to attain the "L" level according to a write data signal Dj. Charges of the amount corresponding to the potential (the "H" level or the "L" level) of bit line BL or /BL are stored in capacitor C of the selected memory cell MC.

During a read mode, first, bit line equalize signal BLEQ falls to the "L" level, and the equalizing operation of bit lines BL, /BL is interrupted. Then, row decoder 15 causes memory array block MAk to be selected, for instance, signals BLIR, BLIL respectively attain the "H" level and the "L" level, and memory array block MAk is coupled to sense amplifier bands SAk and SAk+1. At the same time, word line WL of a row corresponding to row address signals RA0 to RAi rises to the select level or the "H" level. Thus, the potentials of bit lines BL, /BL change by a very small amount according to the amount of charge in capacitor C of the activated memory cell MC.

Then, sense amplifier activating signals SE, /SE respectively attain the "H" level and the "L" level, and sense amplifier 27 is activated. When the potential of bit line BL is slightly higher than the potential of bit line /BL, resistance values of MOS transistors 28 and 31 become smaller than resistance values of MOS transistors 29 and 30, respectively, and the potential of bit line BL is pulled up to the "H" level (power-supply potential VCC) while the potential of bit line /BL is pulled down to the "L" level (ground potential GND). Conversely, when the potential of bit line /BL is slightly higher than the potential of bit line BL, the resistance values of MOS transistors 29 and 30 become smaller than the resistance values of MOS transistors 28 and 31, and the potential of bit line /BL is pulled up to the "H" level while the potential of bit line BL is pulled down to the "L" level.

Then, column decoder 16 causes column select line CSL of a column corresponding to column address signals CA0 to CAi' to rise to the select level or the "H" level, and column select gate 24 of that column is rendered conductive. A data signal Qj of bit line pair BL, /BL of the selected column is output to logic circuit portion 2 via column select gate 21, data input/output line pair IO, /IO, global data input/output line pair GIO, /GIO, and IO buffer 13.

Figure 6A:
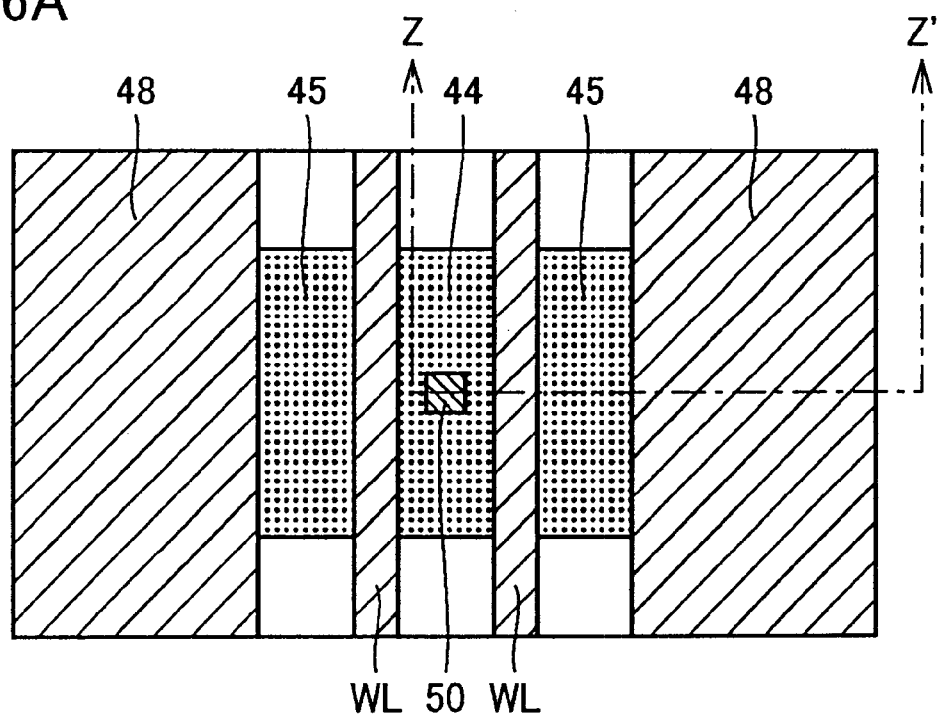
FIGS. 6A and 6B are diagrams representing an arrangement of a memory cell shown in FIG. 4.
Figure 6B:
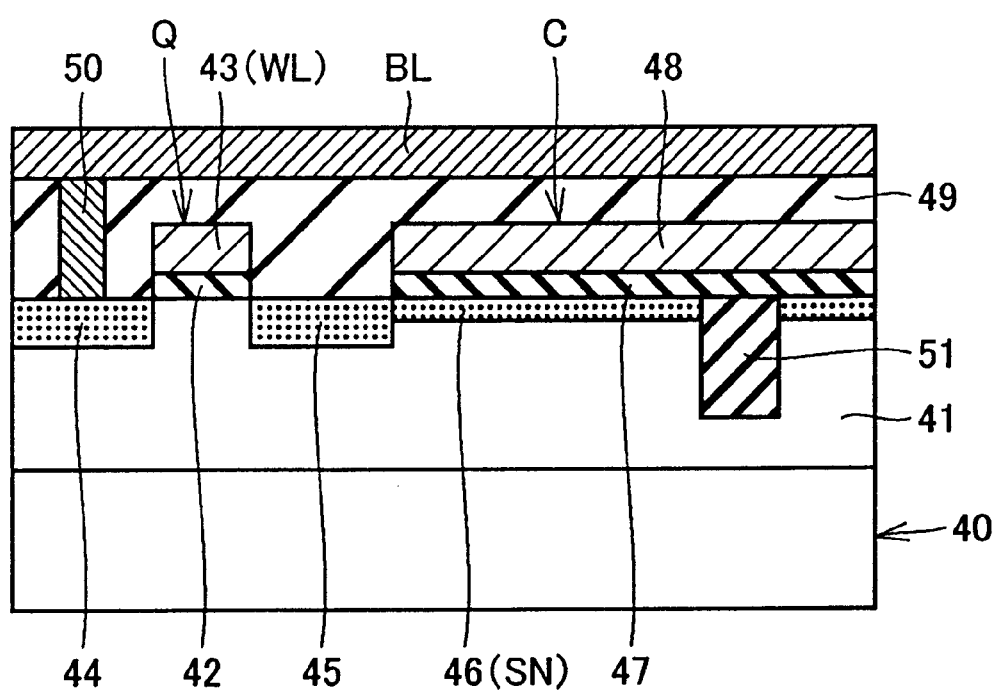

An arrangement of a memory cell MC and a method of data write which characterize the present invention will be described in detail below. FIGS. 6A and 6B are diagrams representing the arrangement of memory cell MC of memory circuit portion 3. FIG. 6B is a cross sectional view taken along a line Z–Z' in FIG. 6A, and bit line BL is not shown in FIG. 6A.

In FIGS. 6A and 6B, a P-type well 41 is formed on either surface of a crystal silicon substrate 40, and an N-channel MOS transistor Q and a capacitor C are formed on a surface of P-type well 41. N-channel MOS transistor Q is formed by forming a gate electrode 43 on a surface of P-type well 41 with a gate insulating film 42 disposed therebetween and by forming a source region 44 and a drain region 45 on either side of gate electrode 43. Gate electrode 43 forms a portion of word line WL. Source region 44 and drain region 45 are formed by an N-type diffusion layer. Capacitor C has a so-called planar-type capacitor structure in which an N-type diffusion layer (or an inversion layer) 46 (storage node SN) is formed on a surface of P-type well 41, and a cell plate electrode 48 is formed on a surface of N-type diffusion layer 46 with an insulating layer 47 disposed therebetween.

Here, gate electrode 43 (word line WL) of N-channel MOS transistor Q of memory cell MC and cell plate electrode 48 of capacitor C are formed by the same interconnection layer. The interconnection layer may be formed by polycrystalline silicon having impurities introduced (doped polysilicon) or may be formed by polycide using WSix, CoSix and the like, or may be formed by a so-called salicide technique. The interconnection layer is also used for a gate electrode of an MOS transistor in the CMOS logic process.

Bit line BL is formed above N-channel MOS transistor Q and capacitor C with an insulating layer 49 disposed therebetween. Such a structure is called a CBU structure. Bit line BL is formed by a first metal interconnection layer. Source region 44 of N-channel MOS transistor Q is connected to bit line BL via a contact hole 50.

A plurality of memory cells MC connected to one bit line BL are divided into groups of two memory cells MC. Source region 44 of N-channel MOS transistor Q and contact hole 50 are provided in common to the two memory cells MC forming a pair. Memory cells MC connected to this bit line BL and memory cells MC connected to other bit line /BL are isolated by an element isolating layer 51.

According to the first embodiment, first, a planar-type capacitor C is employed, and cell plate electrode 48 and word line WL are formed by the same interconnection layer so that there is no need separately to provide the interconnection layers for forming a cell plate electrode and a storage node, and no step is created between memory arrays 9 to 12 and the peripheral circuit portion. Thus, system LSI 1 can be formed by the CMOS logic process alone, and reduction in the cost of system LSI 1 can be achieved.

Figure 7:
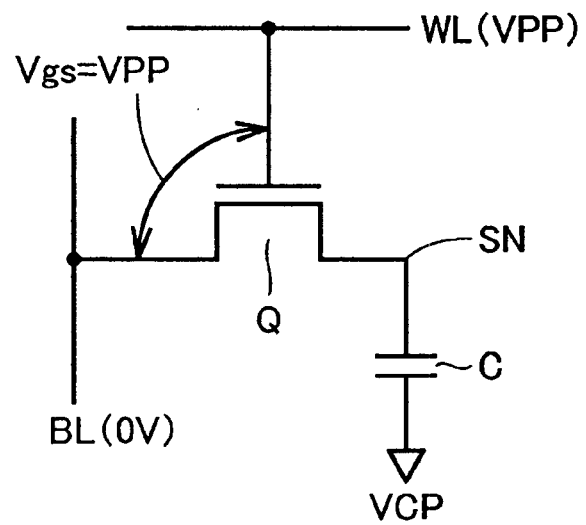
FIGS. 7 and 8 are diagrams related to the description of problems of the memory cell shown in FIGS. 6A and 6B.

In order sufficiently to write a data signal of the "H" level (power-supply potential VCC) into a storage node SN of a memory cell MC, or in order sufficiently to read a data signal of the "H" level from storage node SN of memory cell MC, a potential VPP that is sufficiently higher than a potential VCC+Vtn, which is the sum of power-supply potential VCC and a threshold voltage Vtn of N-channel MOS transistor Q of memory cell MC, need to be applied to word line WL. As shown in FIG. 7, when a boosted potential VPP is applied to word line WL and sense amplifier 27 causes bit line BL to attain a ground potential GND (0 V), Vgs=VPP is applied to the gate insulating film of N-channel MOS transistor Q. Thus, the thickness of the gate insulating film of N-channel MOS transistor Q need to be made thick so as to allow the gate insulating film to endure a high voltage VPP. On the other hand, an insulating film of capacitor C need to be made thin so as to provide a large capacitance.

Figure 8:
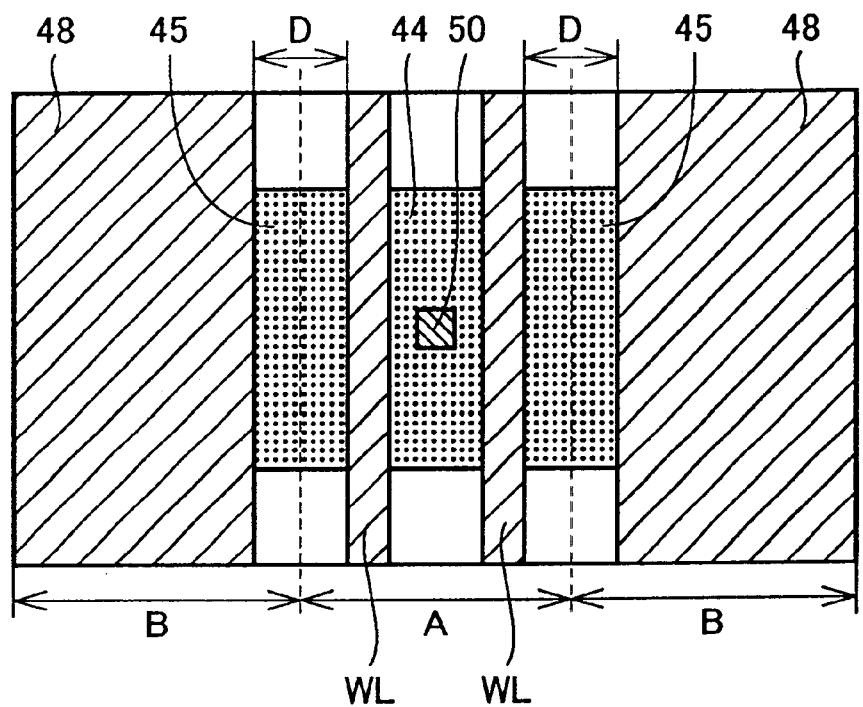

For this purpose, there is a need to employ a dual gate insulating film process which allows gate insulating films of different thickness to coexist, and as shown in FIG. 8, a thick insulating film need to be formed in a region A of N-channel MOS transistor Q while a thin insulating film need to be formed in a region of capacitor C. When such a structure is employed, however, there is a need to increase the distance between a word line WL and cell plate electrode 48 so that the size of memory cell MC would be increased.

Thus, according to the first embodiment, secondly, a method of data write is employed which prevents dielectric breakdown from occurring in gate insulating film 42 of N-channel MOS transistor Q even when gate insulating film 42 of N-channel MOS transistor Q is set to have the same thin thickness as that of insulating film 47 of capacitor C, thereby preventing the increase in the size of memory cell MC.

Figure 9:
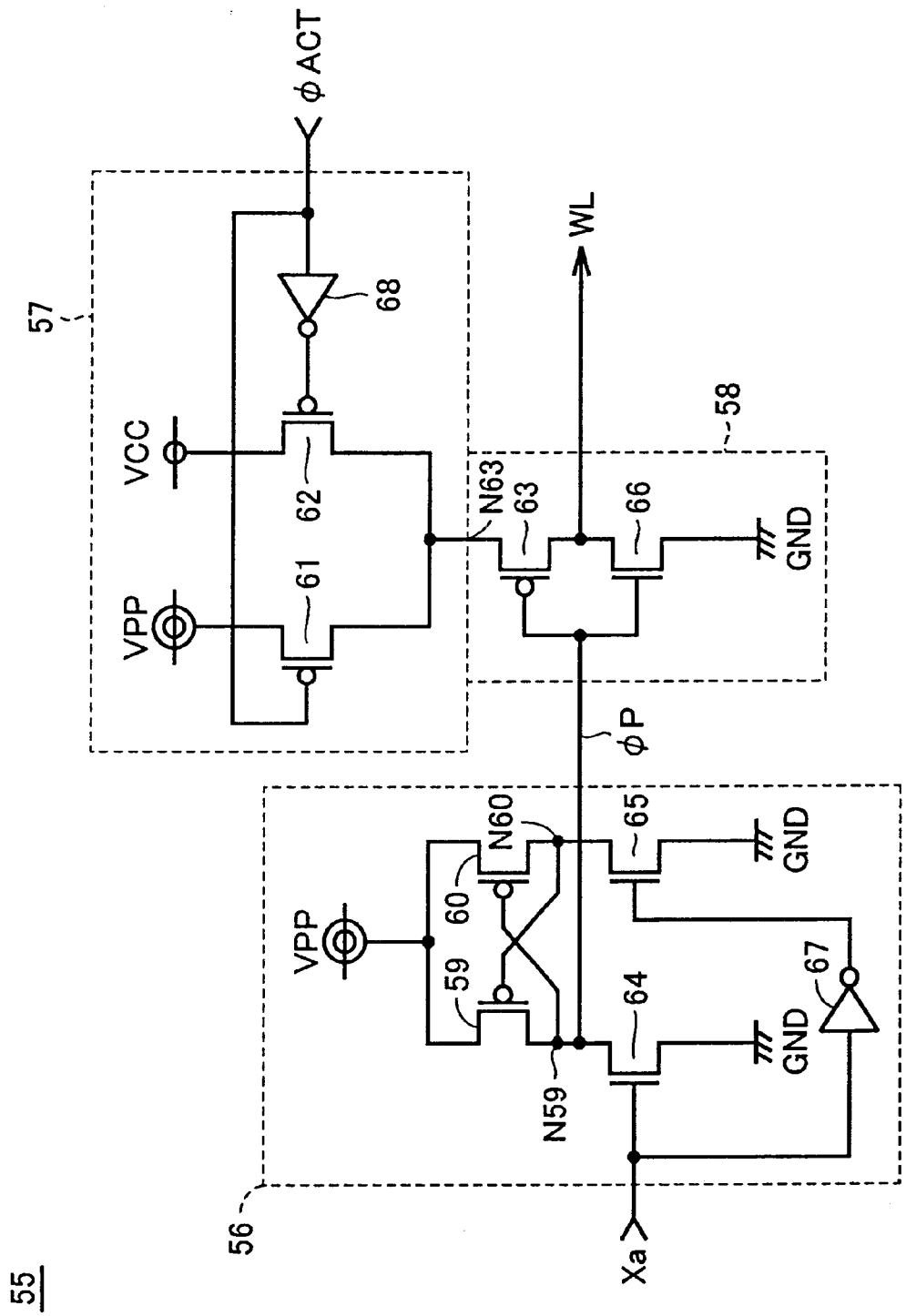
FIG. 9 is a circuit diagram representing an arrangement of a word driver included in a row decoder shown in FIG. 3.

FIG. 9 is a circuit diagram representing an arrangement of a word driver 55 of memory circuit portion 3. Word driver 55 is a circuit included in row decoder 15 of FIG. 3 and is provided corresponding to each word line WL. Word driver 55 includes a level shifter 56, a switching circuit 57, and an inverter 58.

Level shifter 56 converts a signal Xa whose "H" level is power-supply potential VCC and whose "L" level is ground potential GND into a signal whose "H" level is boosted potential VPP and whose "L" level is ground potential GND, and further inverts the converted signal. Signal Xa is a predecoded signal and attains the active level or the "H" level when row address signals RA0 to RAi designating a corresponding word line WL are input.

Level shifter 56 includes P-channel MOS transistors 59, 60, N-channel MOS transistors 64, 65, and an inverter 67. P-channel MOS transistors 59, 60 are respectively connected between a line of boosted potential VPP and nodes N59, N60, and their gates are respectively connected to nodes N60, N59. N-channel MOS transistors 64, 65 are respectively connected between nodes N59, N60 and a line of ground potential GND. Signal Xa is directly input to a gate of N-channel MOS transistor 64 as well as to a gate of N-channel MOS transistor 65 via inverter 67. A signal that emerges at node N59 becomes an output signal φP of level shifter 56.

When signal Xa is at the inactive level or the "L" level, N-channel MOS transistor 64 is rendered non-conductive, while N-channel MOS transistor 65 is rendered conductive. Thus, node N60 attains the "L" level and P-channel MOS transistor 59 is rendered conductive, and the potential of node N59, that is, signal φP, attains boosted potential VPP and P-channel MOS transistor 60 is rendered non-conductive.

When signal Xa is at the active level or the "H" level, N-channel MOS transistor 64 is rendered conductive, while N-channel MOS transistor 65 is rendered non-conductive. Thus, signal φP attains the "L" level and P-channel MOS transistor 60 is rendered conductive, and node N60 attains boosted potential VPP and P-channel MOS transistor 59 is rendered non-conductive.

Switching circuit 57 includes P-channel MOS transistors 61, 62, and an inverter 68. P-channel MOS transistor 61 is connected between a line of boosted potential VPP and a power-supply node N63 of inverter 58. P-channel MOS transistor 62 is connected between a line of power-supply potential VCC and power-supply node N63 of inverter 58. A signal φACT is directly input to a gate of P-channel MOS transistor 61 as well as to a gate of P-channel MOS transistor 62 via inverter 68.

When signal φACT is at the "H" level (boosted potential VPP), P-channel MOS transistor 61 is rendered non-conductive while P-channel MOS transistor 62 is rendered conductive, and power-supply potential VCC is supplied to power-supply node N63 of inverter 58. When signal φACT is at the "L" level (ground potential GND), P-channel MOS transistor 61 is rendered conductive while P-channel MOS transistor 62 is rendered non-conductive, and boosted potential VPP is supplied to power-supply node N63 of inverter 58.

Inverter 58 includes a P-channel MOS transistor 63 and an N-channel MOS transistor 66. P-channel MOS transistor 63 is connected between power-supply node N63 and a corresponding word line WL, and its gate receives output signal φP of level shifter 56. N-channel MOS transistor 66 is connected between a corresponding word line WL and a line of ground potential GND, and its gate receives signal φP.

When signal φP is at the "L" level, P-channel MOS transistor 63 is rendered conductive while N-channel MOS transistor 66 is rendered non-conductive, and a potential VPP or VCC of power-supply node N63 is supplied to word line WL. When signal φP is at the "H" level, P-channel MOS transistor 63 is rendered non-conductive while N-channel MOS transistor 66 is rendered conductive, and ground potential GND is supplied to word line WL.

Figure 10:
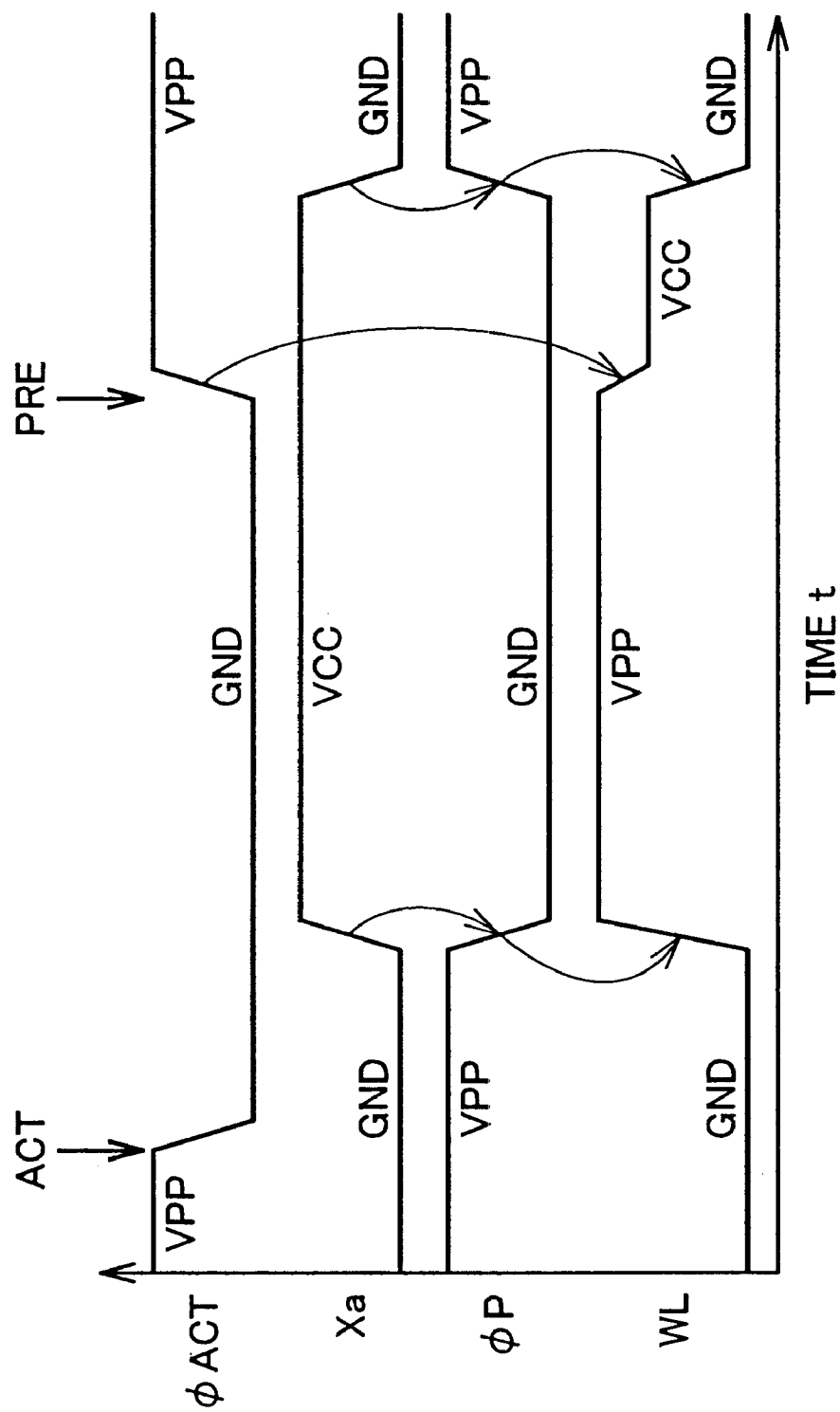
FIG. 10 is a timing chart showing an operation of the word driver shown in FIG. 9.

FIG. 10 is a timing chart showing an operation of word driver 55 shown in FIG. 9. In a standby state, signal φACT is at the "H" level, and P-channel MOS transistor 61 is non-conductive while P-channel MOS transistor 62 is conductive, and power-supply potential VCC is supplied to power-supply node N63 of inverter 58. In addition, signal Xa is at the "L" level, and signal φP is at boosted potential VPP and P-channel MOS transistor 63 is non-conductive, while N-channel MOS transistor 66 is conductive, and word line WL is at ground potential GND.

At a certain point in time, when an active command ACT is input by control signals /RAS, /CAS, and so on, signal φACT falls to the "L" level in the selected memory array block (for instance, MAk). Consequently, P-channel MOS transistor 61 is rendered conductive while P-channel MOS transistor 62 is rendered non-conductive, and boosted potential VPP is supplied to power-supply node N63 of inverter 58.

When a prescribed time period has elapsed after active command ACT is input, signal Xa rises to the active level or the "H" level, and signal φP falls to the "L" level. Consequently, N-channel MOS transistor 66 is rendered non-conductive while P-channel MOS transistor 63 is rendered conductive, and word line WL attains boosted potential VPP.

Figure 11:
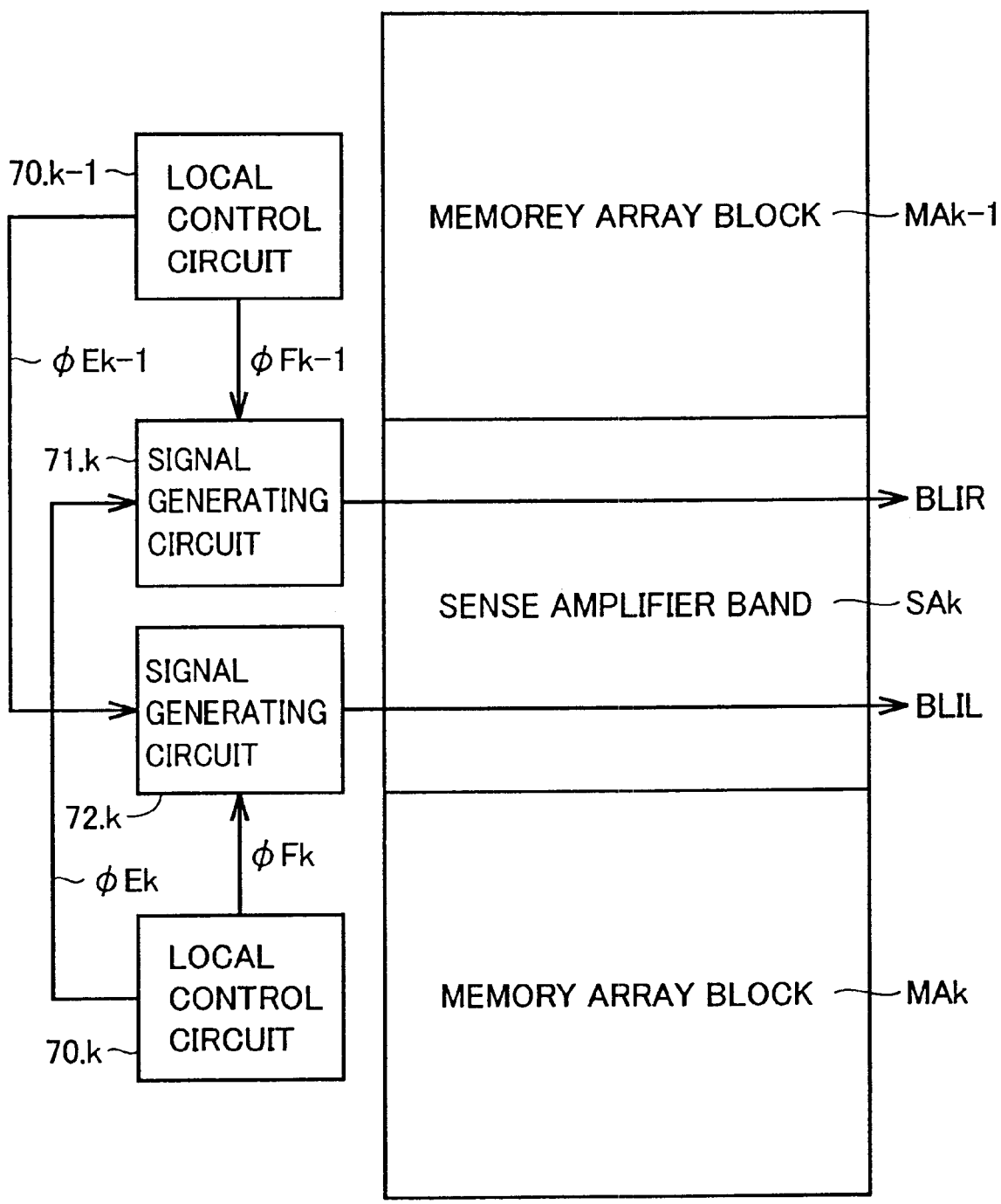
FIG. 11 is a block diagram representing a signal generating circuit and a local control circuit provided corresponding to the sense amplifier band and the memory array block shown in FIG. 3.

In addition, in memory circuit portion 3, as shown in FIG. 11, a local control circuit 70 is provided corresponding to each memory array block MA, and two signal generating circuits 71 and 72 are provided corresponding to each sense amplifier band SA. FIG. 11 shows local control circuits 70.k-1, 70.k respectively provided corresponding to memory array blocks MAk-1, MAk, and signal generating circuits 71.k, 72.k provided corresponding to sense amplifier band SAk.

Local control circuit 70.k-1 causes each of signals φEk-1, φFk-1 to attain the active level or the "H" level at a prescribed timing in response to a corresponding memory array block MAk-1 being selected by row address signals RA0 to RAi.

Local control circuit 70.k causes each of signals φEk, φFk to attain the active level or the "H" level at a prescribed timing in response to a corresponding memory array block MAk being selected by row address signals RA0 to RAi.

Signal generating circuit 71.k causes signal BLIR to attain ground potential GND when signals φEk, φFk-1 are at the "L" level, causes a signal BLIR to attain power-supply potential VCC when signal φEk attains the "H" level, and causes signal BLIR to attain a negative potential VBB when signal φFk−1 attains the "H" level.

Signal generating circuit 72.k causes signal BLIL to attain ground potential GND when signals φEk−1, φFk are at the "L" level, causes signal BLIL to attain power-supply potential VCC when signal φEk−1 attains the "H" level, and causes signal BLIL to attain negative potential VBB when signal φFk attains the "H" level.

Figure 12:
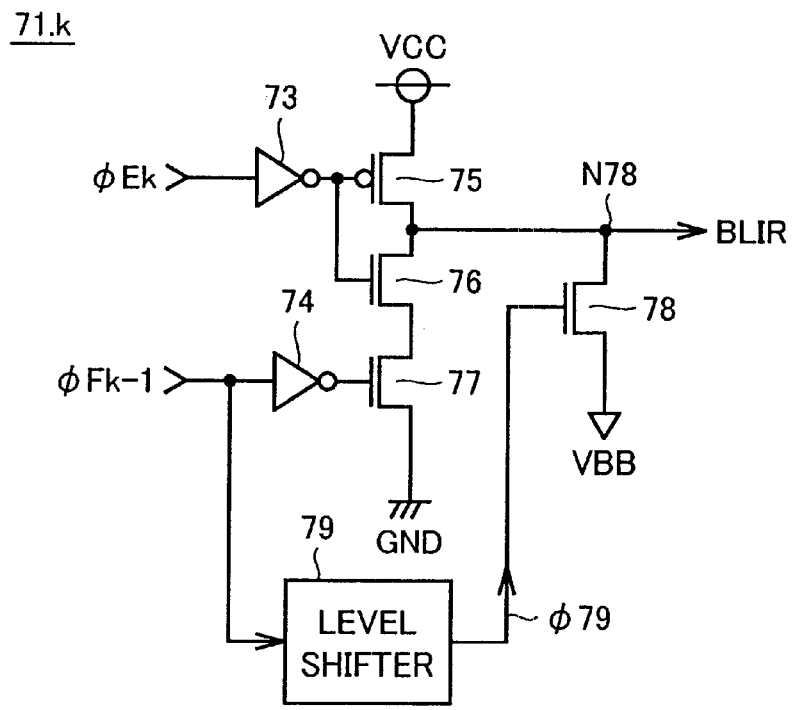
FIG. 12 is a circuit block diagram representing an arrangement of a signal generating circuit 71.k shown in FIG. 11.

FIG. 12 is a circuit block diagram representing the arrangement of signal generating circuit 71.k. In FIG. 12, signal generating circuit 71.k includes inverters 73 and 74, a P-channel MOS transistor 75, N-channel MOS transistors 76 to 78, and a level shifter 79. MOS transistors 75 to 77 are connected in series between a line of power-supply potential VCC and a line of ground potential GND. N-channel MOS transistor 78 is connected between a node N78 between MOS transistors 75, 76 and a line of negative potential VBB. A signal φEk is input to gates of MOS transistors 75 and 76 via inverter 73. A signal φFk−1 is input to a gate of N-channel MOS transistor 77 via inverter 74 as well as to a gate of N-channel MOS transistor 78 via level shifter 79. Moreover, negative potential VBB may be the same as the potential applied to P-type well 41 of FIG. 6 or may be of a different potential level.

Level shifter 79 converts a signal φFk−1 whose "H" level is power-supply potential VCC and whose "L" level is ground potential GND into a signal φ79 whose "H" level is power-supply potential VCC and whose "L" level is negative potential VBB.

Figure 13:
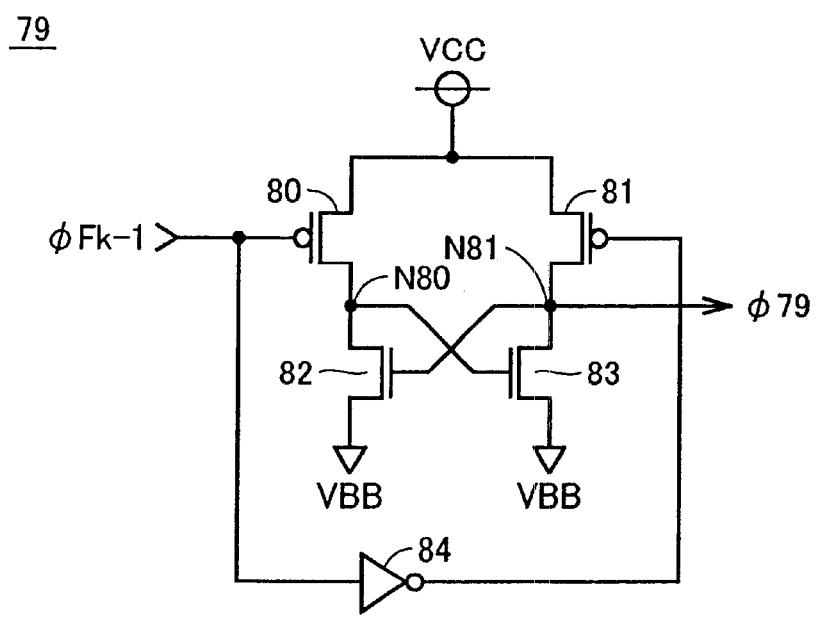
FIG. 13 is a circuit diagram representing an arrangement of a level shifter shown in FIG. 12.

As shown in FIG. 13, level shifter 79 includes P-channel MOS transistors 80 and 81, N-channel MOS transistors 82 and 83, and an inverter 84. P-channel MOS transistors 80, 81 are respectively connected between a line of power-supply potential VCC and nodes N80, N81. Signal φFk−1 is directly input to a gate of P-channel MOS transistor 80 as well as to a gate of P-channel MOS transistor 81 via inverter 84. N-channel MOS transistors 82, 83 are respectively connected between nodes N80, N81 and a line of negative potential VBB, and their gates are respectively connected to nodes N81 and N80. A signal that emerges at nodes N81 becomes output signal φ79 of level shifter 79.

When signal φFk−1 is at the "L" level, P-channel MOS transistor 80 is rendered conductive while P-channel MOS transistor 81 is rendered non-conductive. Consequently, node N80 attains the "H" level and N-channel MOS transistor 83 is rendered conductive, while node N81 attains the "L" level (negative potential VBB) and N-channel MOS transistor 82 is rendered non-conductive. Thus, signal φ79 attains negative potential VBB.

When signal φFk−1 is at the "H" level, P-channel MOS transistor 80 is rendered non-conductive while P-channel MOS transistor 81 is rendered conductive. Consequently, node N81 attains the "H" level (power-supply potential VCC) and N-channel MOS transistor 82 is rendered conductive, while node N80 attains the "L" level and N-channel MOS transistor 83 is rendered non-conductive. Thus, signal φ79 attains power-supply potential VCC.

Referring back to FIG. 12, when signals φEk, φFk−1 are both at the "L" level, N-channel MOS transistors 76 and 77 are rendered conductive while P-channel MOS transistor 75 and N-channel MOS transistor 78 are rendered non-conductive, and signal BLIR attains ground potential GND. When signals φEk, φFk−1 are respectively at the "H" level and the "L" level, P-channel MOS transistor 75 and N-channel MOS transistor 77 are rendered conductive while N-channel MOS transistors 76 and 78 are rendered non-conductive, and signal BLIR attains power-supply potential VCC. When signals φEk, φFk−1 are respectively at the "L" level and the "H" level, N-channel MOS transistors 76 and 78 are rendered conductive while P-channel MOS transistor 75 and N-channel MOS transistor 77 are rendered non-conductive, and signal BLIR attains negative potential VBB. Signals φEk and φFk−1 never attain the "H" level at the same time.

Figure 14:
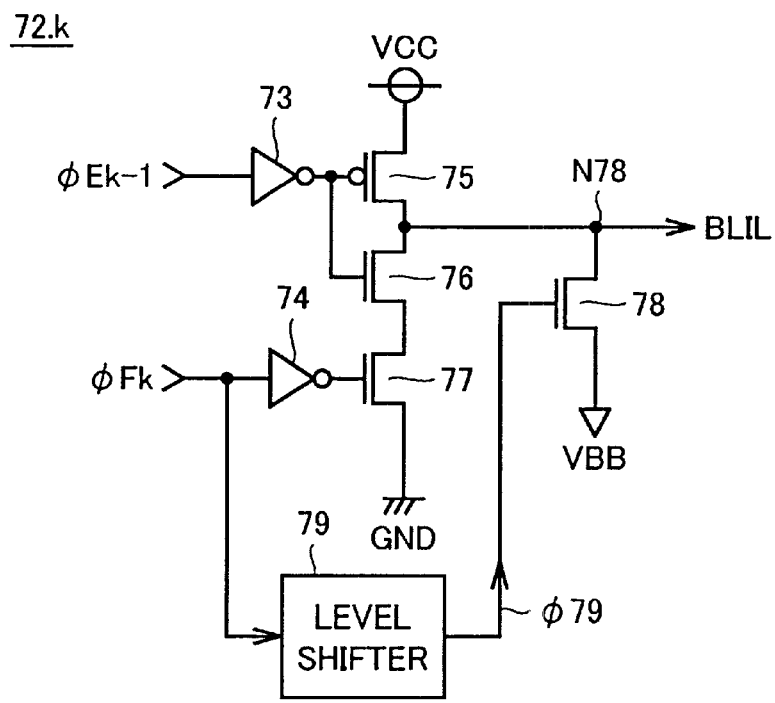
FIG. 14 is a circuit block diagram representing an arrangement of a signal generating circuit 72.k shown in FIG. 11.

As shown in FIG. 14, signal generating circuit 72.k has the same arrangement as signal generating circuit 71.k. In place of signals φEk, φFk−1, however, signals φEk−1, φFk are respectively input, and signal BLIL is output instead of signal BLIR. When signals φEk−1, φFk are both at the "L" level, signal BLIL attains ground potential GND, and when signals φEk−1, φFk are respectively at the "H" level and the "L" level, signal BLIL attains power-supply potential VCC. When signals φEk−1, φFk are respectively at the "L" level and the "H" level, signal BLIL attains negative potential VBB. Signals φEk−1, φFk never attain the "H" level at the same time.

Figure 15:
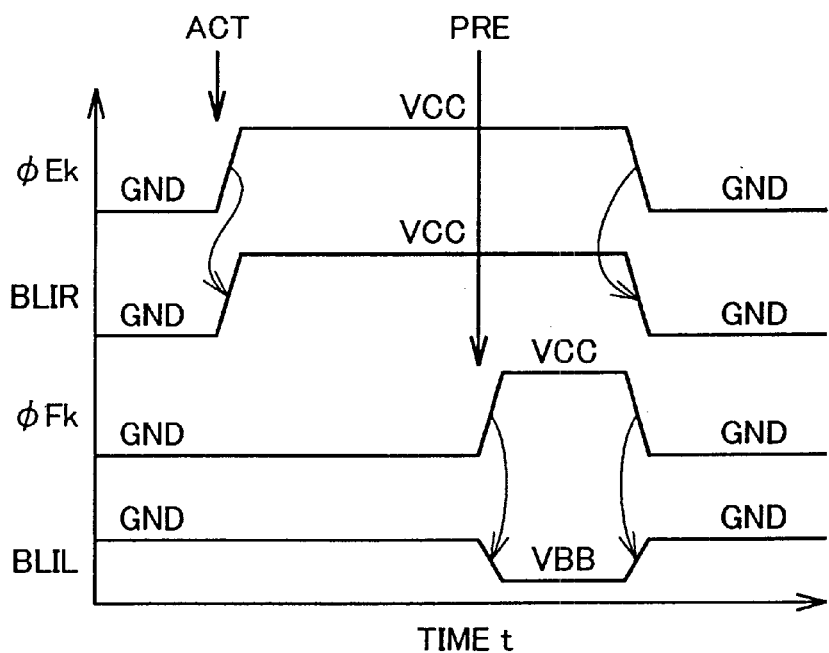
FIG. 15 is a timing chart showing the operations of the signal generating circuit and the local control circuit shown in FIGS. 11 to 14.

FIG. 15 is a timing chart showing the operations of local control circuits 70.k−1, 70.k and signal generating circuits 71.k, 72.k. A case in which memory array block MAk is selected according to row address signals RA0 to RAi will be described.

In a standby state, signals φEk−1, φEk, φFk−1, and φFk are all at the "L" level, and signals BLIR, BLIL are both at ground potential GND. When, at a certain point in time, active command ACT is input and memory array block MAk is selected, local control circuit 70.k causes signal φEk to rise to the "H" level, and signal generating circuit 71.k causes signal BLIR to rise to power-supply potential VCC. Thereafter, when a precharge command PRE is input, local control circuit 70.k causes signal φFk to rise to the "H" level, and signal generating circuit 70.k causes signal BLIL to fall to negative potential VBB. When a prescribed time period has elapsed after precharge command PRE is input, signals φEk, φFk both fall to the "L" level, and signals BLIR, BLIL both attain ground potential GND.

Figure 16:
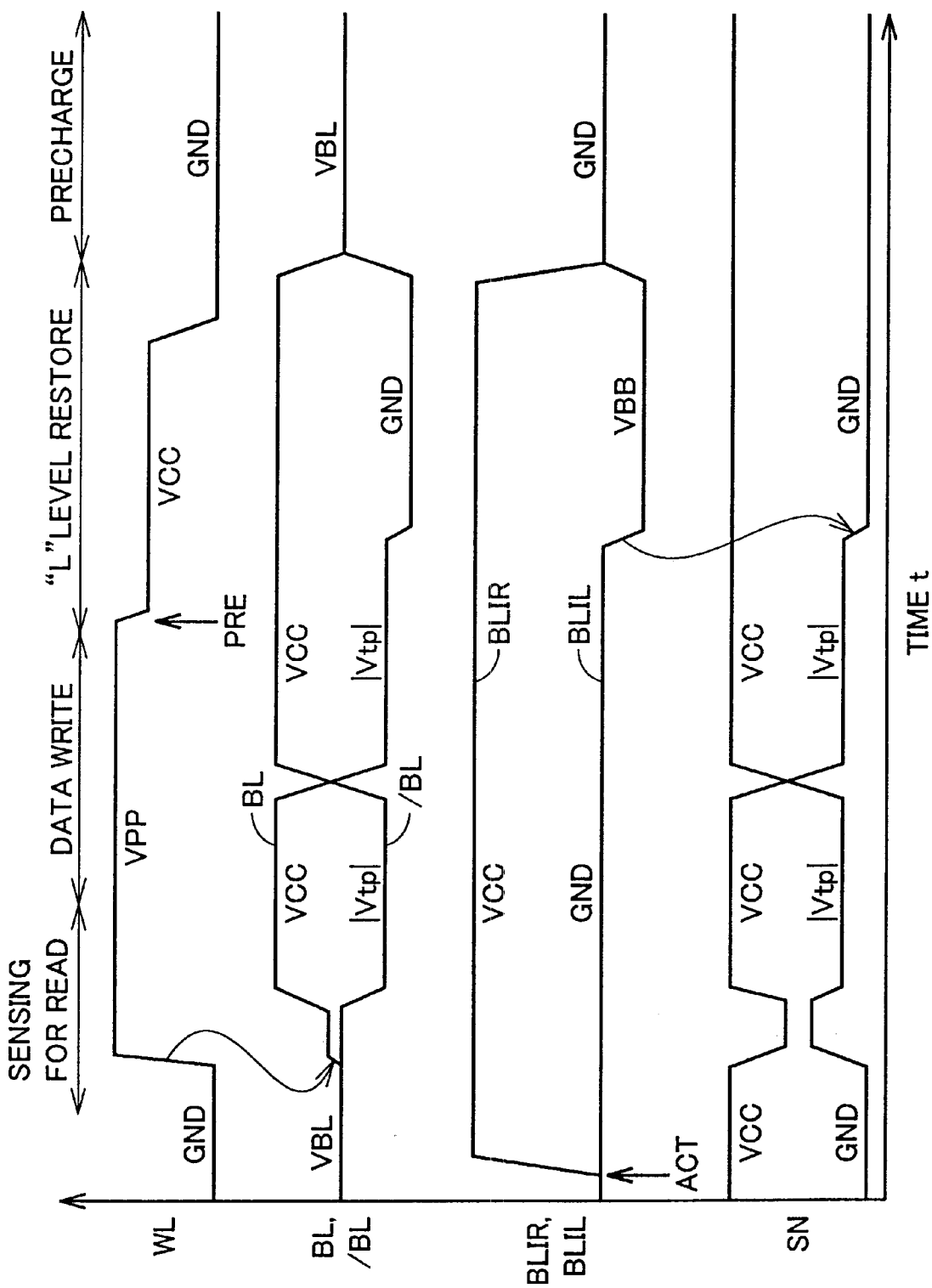
FIG. 16 is a timing chart showing a method of data write of the memory circuit portion shown in FIGS. 1 to 15.

FIG. 16 is a timing chart showing a method of data write of memory circuit portion 3 shown in FIGS. 1 to 15. In FIG. 16, in a standby state, word line WL is at ground potential GND, and N-channel MOS transistor Q of memory cell MC is non-conductive. Storage node SN of memory cell MC holds power-supply potential VCC or ground potential GND. Moreover, signals BLIR and BLIL are both at ground potential GND, and transfer gates 21 and 36 of FIG. 5 are both conductive. In addition, signal BLEQ is at the "H" level, and bit lines BL, /BL are equalized to bit line precharge potential VBL=VCC/2 by equalizer 32 of FIG. 5.

When at a certain point in time, active command ACT is input and memory array block MAk is selected, for instance, signal BLIR rises to the "H" level and transfer gate 21 of FIG. 5 is rendered non-conductive, and sense amplifier 27 is cut off from memory array block MAk−1. In addition, signal BLEQ attains the "L" level, and the equalizing operation of potentials of bit lines BL, /BL is interrupted.

Then, word line WL of a row corresponding to row address signals RA0 to RAi rises to boosted potential VPP. Consequently, N-channel MOS transistor Q of memory cell MC connected to this word line WL is rendered conductive, and a small potential difference corresponding to the stored data of memory cell MC is generated between bit lines BL, /BL. At this time, for instance, it is assumed that the potential of bit line BL is slightly higher than the potential of bit line /BL. Thereafter, sense amplifier activating signals SE, /SE of FIG. 5 respectively attain the "H" level and the "L" level, thereby activating sense amplifier 27, and the small potential difference between nodes N1 and N2 is amplified to power-supply voltage VCC.

At this time, nodes N1 and N2 respectively attain power-supply potential VCC and ground potential GND, while bit lines BL, /BL respectively attain power-supply potential VCC and a threshold voltage |Vtp| of P-channel MOS transistor 38. This is because P-channel MOS transistor 38 is rendered non-conductive when bit line /BL attains |Vtp| even when node N1 and signal BLIL attain ground potential GND.

Figure 17A:
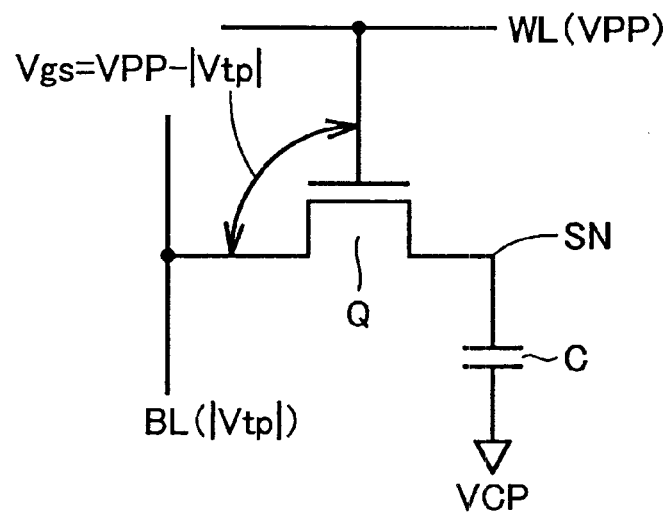
FIGS. 17A and 17B are diagrams related to the description of the effects of the method of data write shown in FIG. 16.

As a result, as shown in FIG. 17A, a voltage Vgs applied to a gate insulating film of N-channel MOS transistor Q of memory cell MC is limited to at most Vgs=VPP−|Vtp|. Threshold voltage |Vtp| of P-channel MOS transistors 22, 23, 37, and 38 of transfer gates 21 and 36 is set such that VPP−|Vtp|≈VCC. Thus, no problem in reliability occurs even when the gate insulating film of N-channel MOS transistor Q of memory cell MC is made to have the same thin thickness as that of the insulating film of capacitor C.

Then, a column select line CSL of a column corresponding to column address signals CA0 to CAi' rises to the select level or the "H" level, and column select gate 24 of FIG. 5 is rendered conductive. Thereafter, one data input/output line (for instance, /IO) of data input/output line pair IO, /IO attains the "H" level while the other data input/output line (IO in this case) attains the "L" level according to a write data signal. Accordingly, sense amplifier 27 causes node N2 to rise to power-supply potential VCC, and node N1 falls to ground potential GND. At this time, while nodes N1, N2 respectively attain ground potential GND and power-supply potential VCC, bit lines BL, /BL respectively attain threshold voltage |Vtp| of P-channel MOS transistor 37 and power-supply potential VCC. Thus, voltage Vgs applied to the gate insulating film of N-channel MOS transistor Q of memory cell MC is limited to at most Vgs=VPP−|Vtp|.

During this period of data write, when the "H" level is written into storage node SN of memory cell MC, storage node SN can be made to attain power-supply potential VCC, and data of the "H" level can be sufficiently written. When data of the "L" level is to be written, however, storage node SN cannot be made to attain ground potential GND so that the data write becomes insufficient. Thus, a restore of the "L" level is performed next.

Figure 17B:
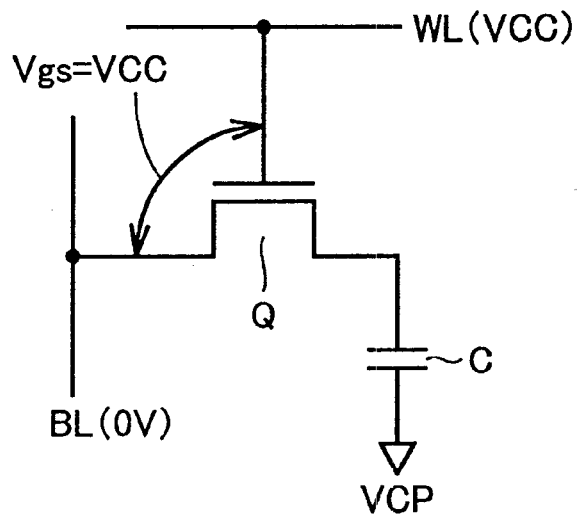

In other words, a precharge command PRE is input to cause word line WL to fall from boosted potential VPP to power-supply potential VCC as well as to cause signal BLIL to fall from ground potential GND to negative potential VBB. Consequently, P-channel MOS transistor 37 of transfer gate 36 of FIG. 5 is rendered conductive again, and bit line BL and storage node SN fall to ground potential GND. Moreover, at this time, as shown in FIG. 17B, voltage Vgs applied to the gate insulating film of N-channel MOS transistor Q of memory cell MC is Vgs=VCC so that there is no fear of dielectric breakdown taking place in the gate insulating film.

Only a short time period is required to restore the "L" level. When the restore of the "L" level is completed, word line WL is raised to the "L" level, N-channel MOS transistor Q of memory cell MC is rendered non-conductive, and the level of storage node SN is maintained. In addition, both signals BLIR and BLIL attain ground potential GND, and transfer gates 21 and 36 are rendered conductive. Both signals SE, /SE attain bit line precharge potential level (VCC/2), thereby rendering sense amplifier 27 inactive, and signal BLEQ attains the "H" level so that bit lines BL, /BL are equalized to bit line potential VBL.

According to the first embodiment, it is set such that VPP−|Vtp|≈VCC, so that the gate insulating film of N-channel MOS transistor Q of memory cell MC can be made to have the same thin thickness as that of the insulating film of capacitor C, and a memory cell MC of a small size can be configured. In addition, the restore of the "L" level is performed after the data write so that the level of a data signal can be sufficiently written into storage node SN of memory cell MC.

Figure 18:
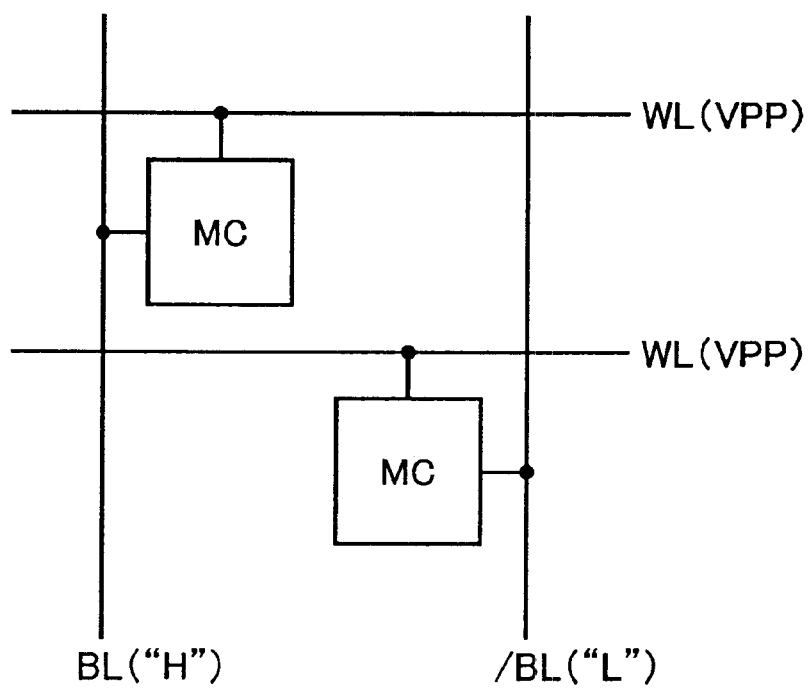
FIGS. 18 and 19 are block diagrams representing two modifications to the first embodiment.
Figure 19:
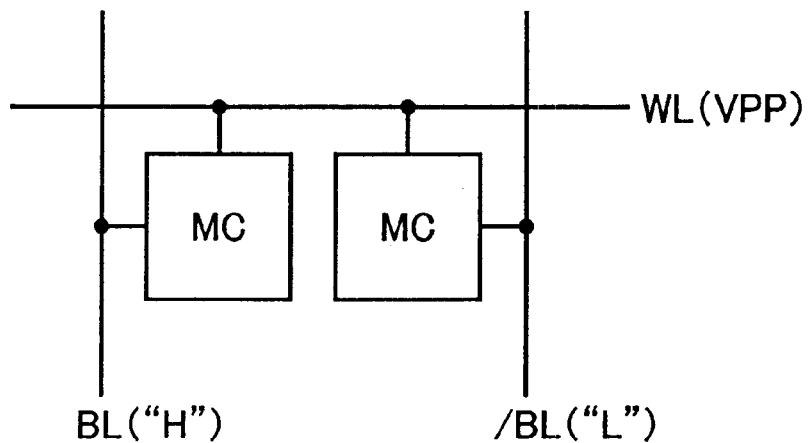

Moreover, according to the first embodiment, boosted potential VPP is supplied to one word line WL, and the "H" level or the "L" level is written into one memory cell MC connected to one bit line BL or /BL to store one bit of data. Needless to say, however, as shown in FIG. 18, the present invention is applicable to a memory in which boosted potential VPP is supplied to two word lines WL, and the "H" level is written into one of two memory cells MC respectively connected to bit lines BL, /BL while the "L" level is written into the other memory cell MC to store one bit of data. In addition, as shown in FIG. 19, the present invention is also applicable to a memory in which boosted potential VPP is supplied to one word line WL, and the "H" level is written into one of two memory cells MC respectively connected to bit lines BL, /BL while the "L" level is written into the other memory cell MC to store one bit of data.

Second Embodiment

Figure 20:
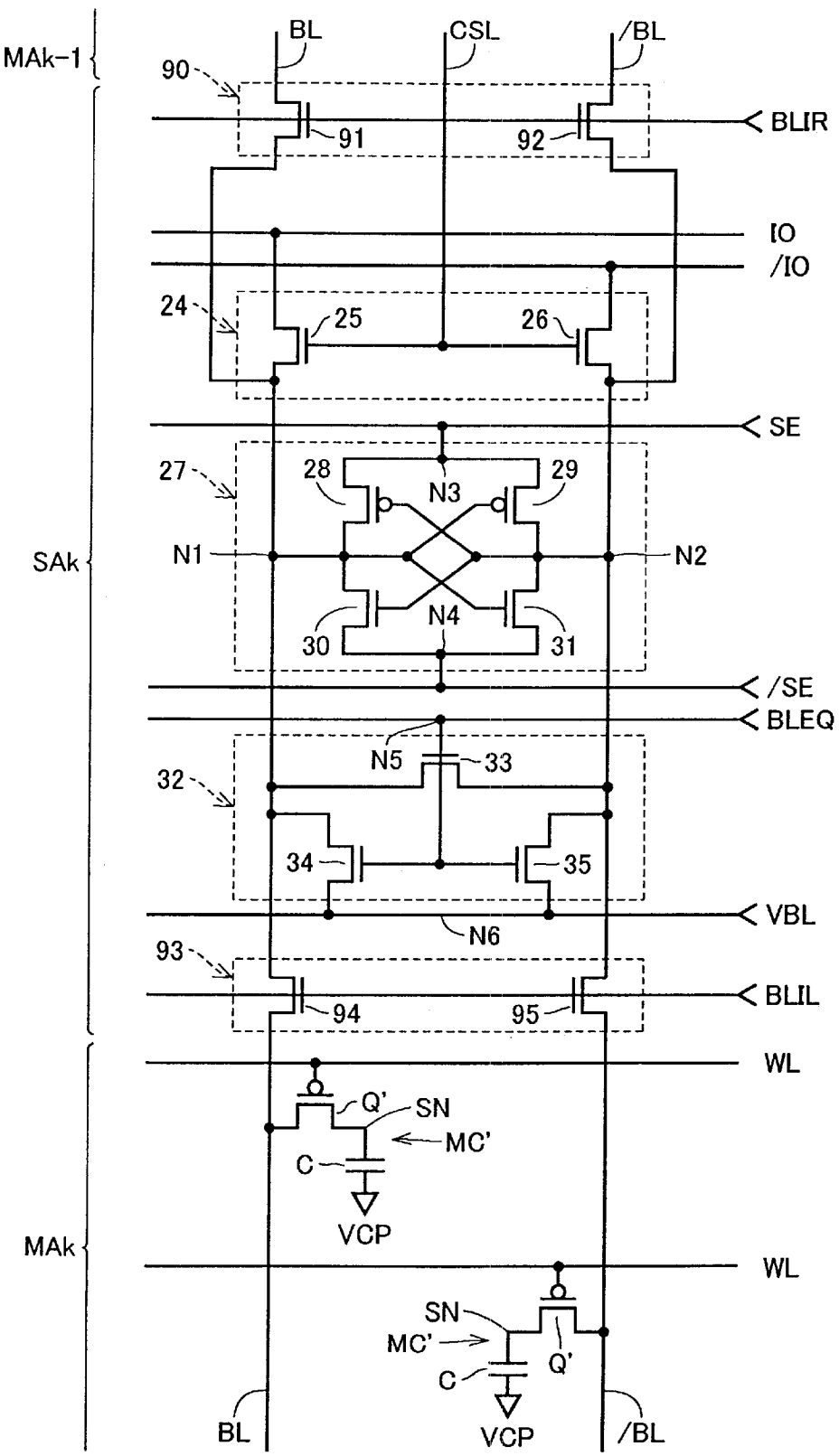
FIG. 20 is a circuit diagram representing the main portion of a memory circuit portion of a system LSI according to a second embodiment of the present invention.

FIG. 20 is a circuit diagram representing the main portion of a memory circuit portion of a system LSI according to the second embodiment of the present invention, and is used in comparison with FIG. 5. As shown in FIG. 20, this memory circuit portion differs from the memory circuit portion of FIG. 5 in that memory cell MC is replaced by a memory cell MC', and transfer gates 21 and 36 are replaced by transfer gates 90 and 93.

Memory cell MC' has a P-channel MOS transistor Q' replacing N-channel MOS transistor Q of memory cell MC. In a standby state, word line WL is held at the non-select level or the "H" level. When row address signals RA0 to RAi are input, a word line WL designated by row address signals RA0 to RAi falls to the select level or the "L" level. When word line WL falls to the "L" level, P-channel MOS transistor Q' of memory cell MC' connected to that word line WL is rendered conductive, and a storage node SN of memory cell MC' is coupled to a bit line BL or /BL. The structure of memory cell MC' is the same as the structure of memory cell MC shown in FIG. 6. Memory cell MC', however, is formed on a surface of an N-type well, and a source region and a drain region of P-channel MOS transistor Q' and storage node SN are formed by a P-type diffusion layer.

Transfer gate 90 has N-channel MOS transistors 91 and 92 replacing P-channel MOS transistors 22 and 23 of transfer gate 21. In a standby state, signal BLIR is held at the "H" level. When memory array block MAk is selected, signal BLIR falls to the "L" level, and transfer gate 90 is rendered non-conductive so that memory array block MAk−1 is cut off from sense amplifier band SAk.

Transfer gate 93 has N-channel MOS transistors 94 and 95 replacing P-channel MOS transistors 37 and 38 of transfer gate 36. In a standby state, signal BLIL is held at the "H" level. When memory array block MAk−1 is selected, signal BLIL falls to the "L" level, and transfer gate 93 is rendered non-conductive so that memory array block MAk is cut off from sense amplifier band SAk.

Figure 21:
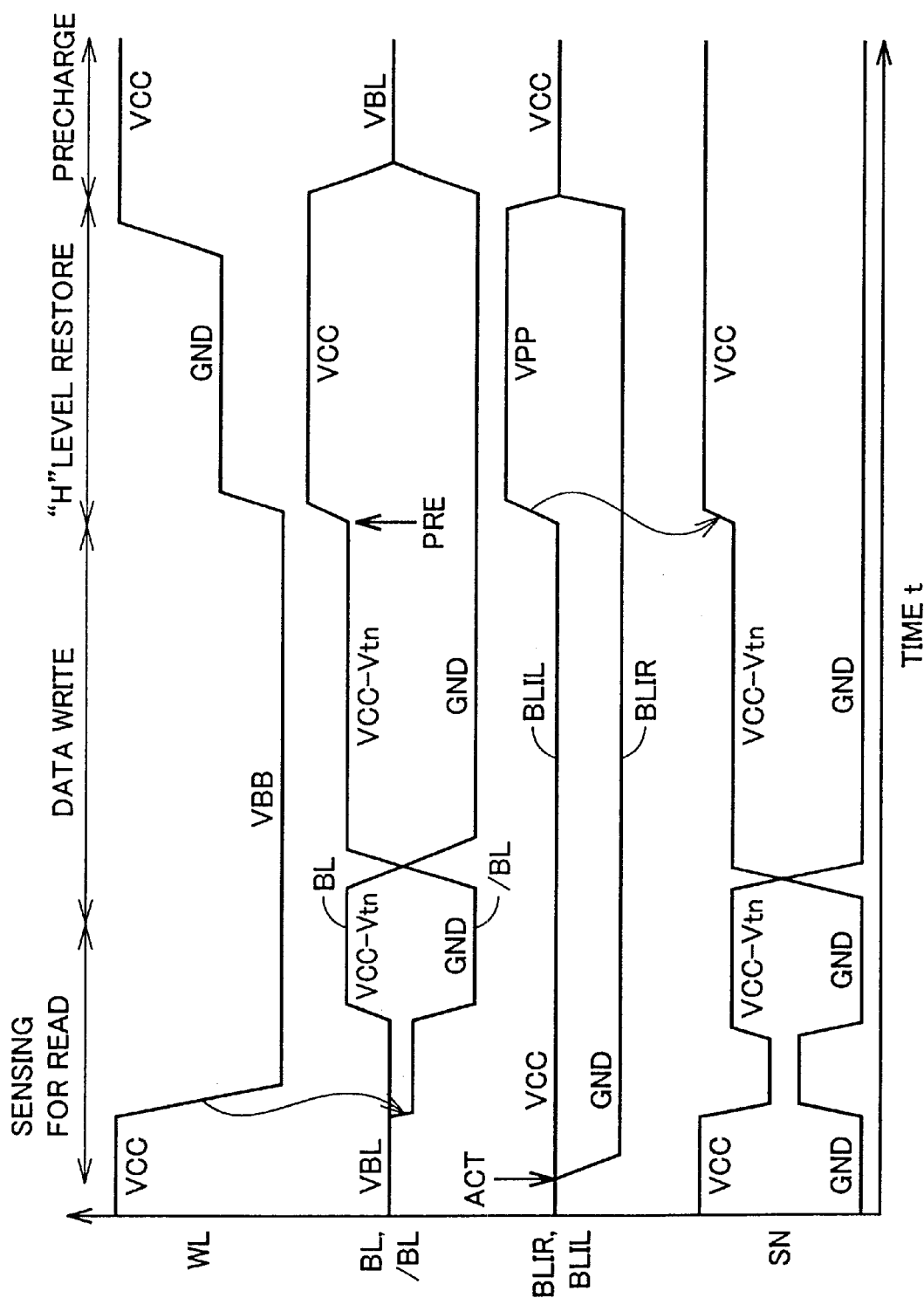
FIG. 21 is a timing chart showing a method of data write of the memory circuit portion shown in FIG. 20.

FIG. 21 is a timing chart showing a method of data write of the memory circuit portion described in relation to FIG. 20, and is used in comparison with FIG. 16. In FIG. 21, in a standby state, word line WL is at power-supply potential VCC, and P-channel MOS transistor Q' of memory cell MC' is non-conductive. Storage node SN of memory cell MC' maintains power-supply potential VCC or ground potential GND. In addition, signals BLIR and BLIL are both at power-supply potential VCC, and transfer gates 90 and 93 are both conductive. Moreover, signal BLEQ is at the "H" level, and bit lines BL, /BL are equalized to bit line potential VBL=VCC/2 by equalizer 32.

When at a certain point in time, active command ACT is input and memory array block MAk is selected, for instance, signal BLIR rises to ground potential GND and transfer gate 90 is rendered non-conductive, and sense amplifier 27 is cut off from memory array block MAk−1. In addition, signal BLEQ attains the "L" level, and the equalizing operation of the potentials of bit lines BL, /BL is interrupted.

Then, word line WL of a row corresponding to row address signals RA0 to RAi falls to negative potential VBB. Consequently, P-channel MOS transistor Q' of memory cell MC' connected to that word line WL is rendered conductive, and a small potential difference corresponding to the stored data of memory cell MC' is generated between bit lines BL, /BL. At this time, for instance, it is assumed that the potential of bit line BL is slightly higher than the potential of bit line /BL. Thereafter, sense amplifier activating signals SE, /SE respectively attain the "H" level and the "L" level, thereby activating sense amplifier 27, and the small potential difference between nodes N1 and N2 is amplified to power-supply potential VCC.

At this time, nodes N1 and N2 respectively attain power-supply potential VCC and ground potential GND, while bit lines BL, /BL respectively attain VCC−Vtn and GND. Vtn is a threshold voltage of N-channel MOS transistor 94. This is because N-channel MOS transistor 94 is rendered non-conductive when bit line BL attains VCC−Vtn even when node N1 and signal BLIL attain power-supply potential VCC.

Consequently, a voltage Vgs applied to a gate insulating film of P-channel MOS transistor Q' of memory cell MC' is limited to at most Vgs=|VBB|+VCC−Vtn. Threshold voltage Vtn of N-channel MOS transistors 91, 92, 94, and 95 of transfer gates 90 and 93 is set such that |VBB|+VCC−Vtn≈VCC. Thus, no problem in reliability occurs even when the gate insulating film of P-channel MOS transistor Q' of memory cell MC' is made to have the same thin thickness as that of the insulating film of capacitor C.

Then, a column select line CSL of a column corresponding to column address signals CA0 to CAi' rises to the select level or the "H" level, and column select gate 24 is rendered conductive. Thereafter, one data input/output line (for instance, /IO) of data input/output line pair IO, /IO attains the "H" level while the other data input/output line (IO in this case) attains the "L" level according to a write data signal. Accordingly, sense amplifier 27 causes node N2 to rise to power-supply potential VCC, and node N1 falls to ground potential GND. At this time, nodes N1 and N2 respectively attain ground potential GND and power-supply potential VCC, while bit lines BL, /BL respectively attain VCC−Vtn and GND. Consequently, voltage Vgs applied to the gate insulating film of P-channel MOS transistor Q' of memory cell MC' is limited to at most Vgs=|VBB|+VCC−Vtn. During this period of data write, when the "L" level is to be written into storage node SN of memory cell MC', storage node SN can be made to attain ground potential GND, and data of the "L" level can be sufficiently written. When data of the "H" level is to be written, however, storage node SN cannot be made to attain power-supply potential VCC so that the data write becomes insufficient. Thus, a restore of the "H" level is performed next.

In other words, a precharge command PRE is input to cause word line WL to rise from negative potential VBB to ground potential GND as well as to cause signal BLIL to rise from power-supply potential VCC to boosted potential VPP. Consequently, N-channel MOS transistor 94 of transfer gate 93 is rendered conductive again, and bit line BL and storage node SN rise to power-supply potential VCC. Moreover, at this time, voltage Vgs applied to the gate insulating film of P-channel MOS transistor Q' of memory cell MC' is Vgs=VCC so that there is no fear of dielectric breakdown taking place in the gate insulating film.

Only a short time period is required to restore the "H" level. When the restore of the "H" level is completed, word line WL rises to power-supply potential VCC, P-channel MOS transistor Q' of memory cell MC' is rendered non-conductive, and the level of storage node SN is maintained. In addition, signals BLIR, BLIL both attain power-supply potential VCC, and transfer gates 90 and 93 are rendered conductive. Signals SE, /SE attain the bit line precharge level VBL, thereby rendering sense amplifier 27 inactive, and signal BLEQ attains the "H" level so that bit lines BL, /BL are equalized to bit line potential VBL.

According to the second embodiment, it is set such that |VBB|+VCC−Vtn≈VCC, so that the gate insulating film of P-channel MOS transistor Q' of memory cell MC' can be made to have the same thin thickness as that of the insulating film of capacitor C, and memory cell MC' of a small size can be configured. In addition, the restore of the "H" level is performed after the data write so that the level of a data signal can be sufficiently written into storage node SN of memory cell MC'.

Needless to say, as described with reference to FIGS. 18 and 19, the second embodiment is also applicable to a mode in which one bit of data is stored using two memory cells MC'.

Third Embodiment

Figure 22:
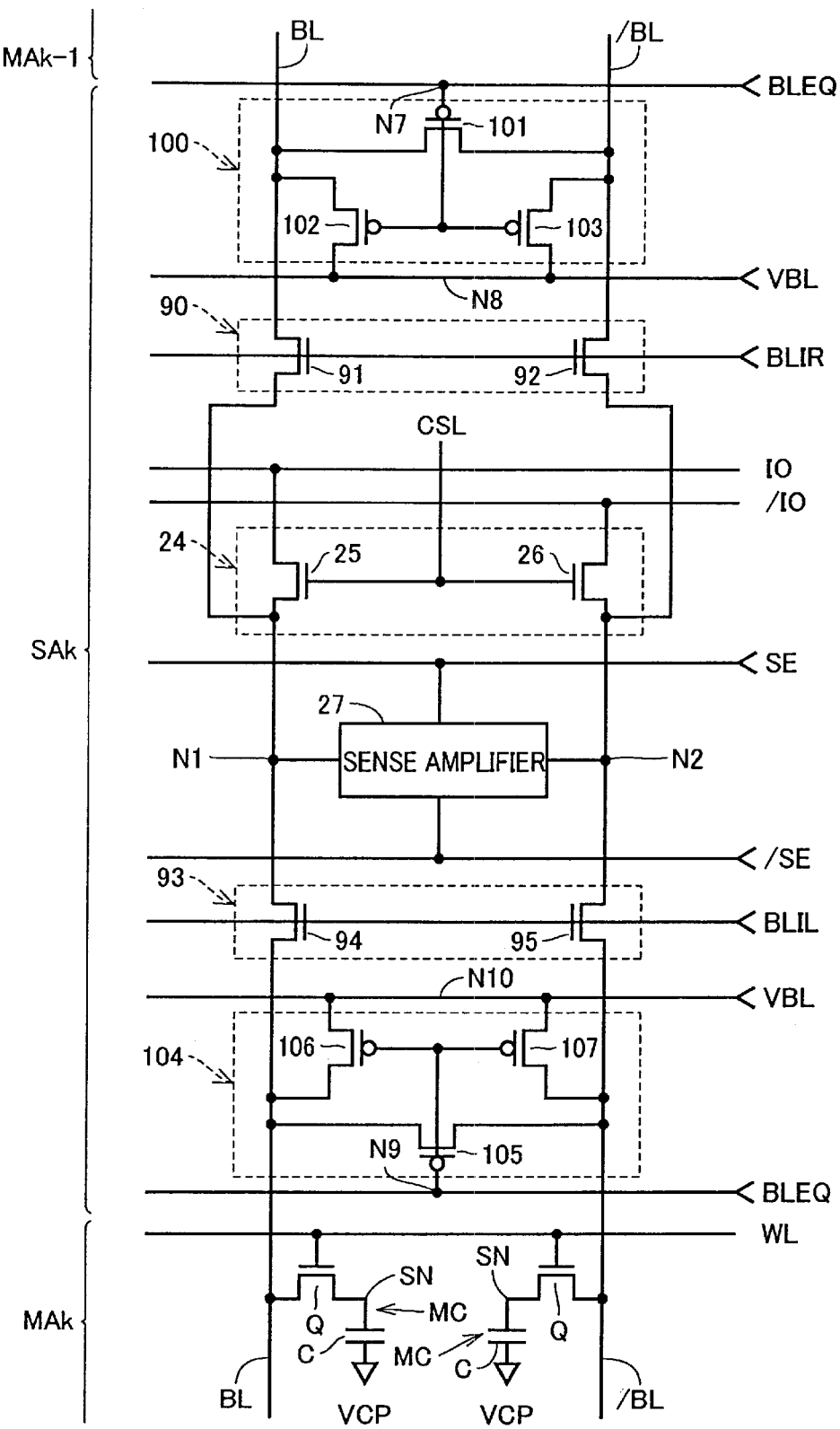
FIG. 22 is a circuit block diagram representing the main portion of a memory circuit portion of a system LSI according to a third embodiment of the present invention.

FIG. 22 is a circuit block diagram representing the main portion of a memory circuit portion of a system LSI according to the third embodiment of the present invention, and is used in comparison with FIG. 20. As shown in FIG. 22, this memory circuit portion differs from the memory circuit portion of FIG. 20 in that two memory cells MC are disposed at the points of intersection between word line WL and bit lines BL, /BL and that equalizer 32 is removed and two equalizers 100 and 104 are provided.

Gates of N-channel MOS transistors Q of two memory cells MC are both connected to a corresponding word line WL, and sources of N-channel MOS transistors Q of two memory cells MC are respectively connected to the corresponding bit lines BL, /BL. The "H" level is written into one of the two memory cells MC, and the "L" level is written into the other memory cell MC. One bit of data is stored using two memory cells MC.

Equalizer 100 includes three P-channel MOS transistors 101 to 103. P-channel MOS transistor 101 is connected between the corresponding bit lines BL and /BL of memory array block MAk−1. P-channel MOS transistors 102 and 103 are respectively connected between the corresponding bit lines BL, /BL and a node N8. Gates of P-channel MOS transistors 101 to 103 are all connected to a node N7. Node N7 receives a bit line equalize signal BLEQ, and node N8 receives a bit line precharge potential VBL=VCC. When signal BLEQ attains the active level or the "L" level, P-channel MOS transistors 101 to 103 are rendered conductive, and bit lines BL, /BL are equalized to a bit line potential VBL.

Equalizer 104 includes three P-channel MOS transistors 105 to 107. P-channel MOS transistor 105 is connected between the corresponding bit lines BL and /BL of memory array block MAk. P-channel MOS transistors 106 and 107 are respectively connected between the corresponding bit lines BL, /BL and a node N10. Gates of P-channel MOS transistors 105 to 107 are all connected to a node N9. Node N9 receives bit line equalize signal BLEQ, and node N10 receives bit line precharge potential VBL=VCC. When signal BLEQ attains the active level or the "L" level, P-channel MOS transistors 105 to 107 are rendered conductive, and bit lines BL, /BL are equalized to bit line precharge potential VBL.

Figure 23:
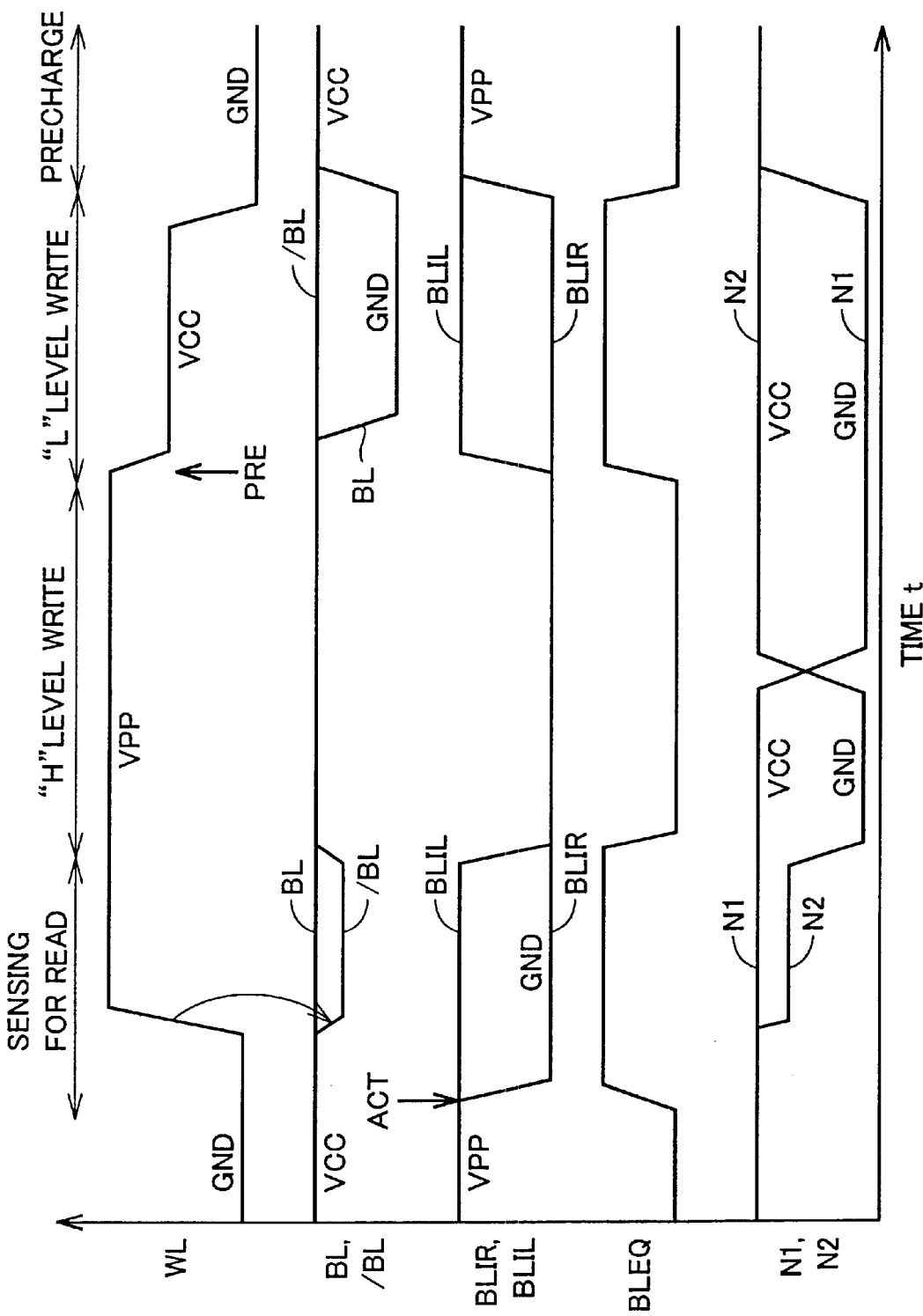
FIG. 23 is a timing chart showing a method of data write of the memory circuit portion shown in FIG. 22.

FIG. 23 is a timing chart showing a method of data write of the memory circuit portion described in relation to FIG. 22. In FIG. 23, in a standby state, word line WL is at ground potential GND, and N-channel MOS transistors Q of two memory cells MC of FIG. 22 are both non-conductive. Power-supply potential VCC is written in one of the two memory cells MC, and the other memory cell MC maintains ground potential GND. In addition, signals BLIR, BLIL are both at boosted potential VPP, and transfer gates 90 and 93 are both conductive. Moreover, signal BLEQ is at the "L" level, and bit lines BL, /BL are equalized to bit line precharge potential VBL=VCC by equalizers 100 and 104.

When at a certain point in time, an active command ACT is input and memory array block MAk is selected, for instance, signal BLIR falls to ground potential GND and transfer gate 90 is rendered non-conductive, and sense amplifier 27 is cut off from memory array block MAk−1. In addition, signal BLEQ attains the "H" level so that the equalizing operation of the potentials of bit lines BL, /BL is interrupted.

Then, word line WL of a row corresponding to row address signals RA0 to RAi rises to boosted potential VPP. Consequently, N-channel MOS transistors Q of the two memory cells MC of FIG. 22 connected to that word line WL are rendered conductive, and a small potential difference corresponding to the stored data of the two memory cells MC is generated between bit lines BL, /BL. At this time, for instance, it is assumed that the potential of bit line BL is slightly higher than the potential of bit line /BL.

Then, signals BLIL, BLIR both attain ground potential GND and transfer gates 90 and 93 are rendered non-conductive, and sense amplifier 27 is cut off from two memory array blocks MAk−1, MAk. In addition, signal BLEQ falls to the "L" level, and equalizers 100 and 104 are activated so that bit line pairs BL, /BL of memory array blocks MAk−1, MAk are equalized to bit line precharge potential VBL=VCC. At this time, ground potential GND is supplied to gates of P-channel MOS transistors 101 to 103 and 105 to 107 of equalizers 100 and 104, and boosted potential VPP is applied to word line WL of FIG. 22 so that sufficient "H" level (power-supply potential VCC) is supplied to storage nodes SN of two memory cells MC.

Moreover, sense amplifier activating signals SE, /SE respectively attain the "H" level and the "L" level, thereby activating sense amplifier 27, and a small potential difference between nodes N1 and N2 is amplified to power-supply voltage VCC.

At this time, voltage Vgs applied to a gate insulating film of an N-channel MOS transistor Q of a memory cell MC is Vgs=VPP−VCC so that no problem in reliability occurs even when the gate insulating film of N-channel MOS transistor Q of memory cell MC is made to have the same thin thickness as that of the insulating film of capacitor C.

Then, column select line CSL of a column corresponding to column address signals CA0 to CAi' rises to the select level or the "H" level, and column select gate 24 is rendered conductive. Thereafter, one data input/output line (for instance, /IO) of data input/output line pair IO, /IO attains the "H" level while the other data input/output line (I/O in this case) attains the "L" level according to a write data signal. Accordingly, sense amplifier 27 causes node N2 to rise to power-supply potential VCC, and node N1 falls to ground potential GND.

When a precharge command PRE is input, word line WL falls from boosted potential VPP to power-supply potential VCC, while signal BLEQ rises to the "H" level, and equalizers 100 and 104 are rendered inactive. In addition, signal BLIL rises to boosted potential VPP, and transfer gate 93 is rendered conductive. Potentials GND, VCC of nodes N1 and N2 are respectively transmitted to bit lines BL, /BL of memory array block MAk, and are respectively written into storage nodes SN of two memory cells MC. At this time, signal BLIL is at boosted potential VPP so that sufficient "L" level would be written into a storage node SN of one memory cell MC. Moreover, at this time, voltage Vgs applied to a gate insulating film of an N-channel MOS transistor Q of a memory cell MC is Vgs=VCC so that there is no fear of dielectric breakdown taking place in the gate insulating film.

When the writing of the "L" level is completed, word line WL falls to ground potential GND, and N-channel MOS transistors Q of memory cells MC are rendered non-conductive, and the levels of storage nodes SN are maintained. In addition, signals BLIR, BLIL both attain boosted potential VPP and transfer gates 90 and 93 are rendered conductive, and signals SE, /SE attain the bit line precharge potential level of VCC/2 so that sense amplifier 27 is rendered inactive. Signal BLEQ attains the "L" level, and bit lines BL, /BL are equalized to bit line precharge potential VBL.

According to the third embodiment, first, word line WL is caused to attain boosted potential VPP and data of the "H" level is written into one memory cell MC, and then, word line WL is caused to attain power-supply potential VCC and data of the "L" level is written into the other memory cell MC. Thus, voltage Vgs applied to a gate insulating film of N-channel MOS transistor Q of memory cell MC can be made to be VCC or below, and the gate insulating film of N-channel MOS transistor Q of memory cell MC can be made to have the same thin thickness as that of the insulating film of capacitor C, which ultimately allows a memory cell MC of a small size to be configured. In addition, the "H" level or the "L" level can be sufficiently written into a storage node SN of memory cell MC.

Moreover, the third embodiment is applied to a mode in which a data signal of one bit is stored using two memory cells MC and the two memory cells MC are connected to one word line WL. Needless to say, however, this method of data write is also applicable to a mode in which one bit of data is stored using one memory cell MC, and as shown in FIG. 8, it can also be applied to a mode in which a data signal of one bit is stored using two memory cells MC and the two memory cells MC are respectively connected to two word lines WL.

Fourth Embodiment

Figure 24:
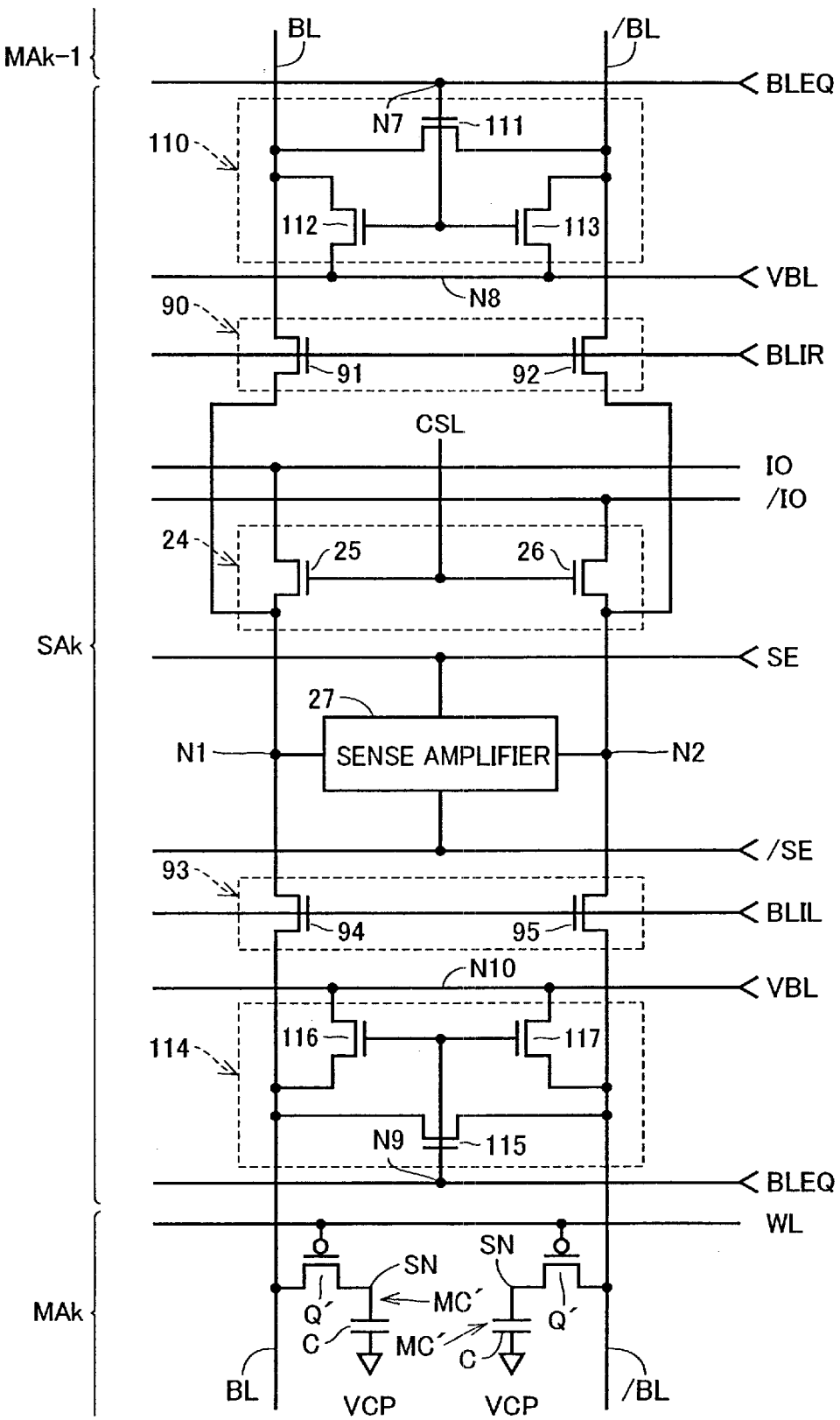
FIG. 24 is a circuit block diagram representing the main portion of a memory circuit portion of a system LSI according to a fourth embodiment of the present invention.

FIG. 24 is a circuit block diagram representing the main portion of a memory circuit portion of a system LSI according to the fourth embodiment of the present invention, and is used in comparison with FIG. 22. As shown in FIG. 24, this memory circuit portion differs from the memory circuit portion of FIG. 22 in that memory cell MC is replaced by a memory cell MC', and equalizers 100 and 104 are replaced by equalizers 110 and 114.

Gates of P-channel MOS transistors Q' of two memory cells MC are both connected to a corresponding word line WL, and sources of P-channel MOS transistors Q' of two memory cells MC' are respectively connected to the corresponding bit lines BL, /BL. The "H" level is written into one of the two memory cells MC', and the "L" level is written into the other memory cell MC'. One bit of data is stored using two memory cells MC'.

Equalizer 111 includes three N-channel MOS transistors 111 to 113. N-channel MOS transistor 111 is connected between the corresponding bit lines BL and /BL of memory array block MAk−1. N-channel MOS transistors 112 and 113 are respectively connected between the corresponding bit lines BL, /BL and a node N8. Gates of N-channel MOS transistors 111 to 113 are all connected to a node N7. Node N7 receives a bit line equalize signal BLEQ, and node N8 receives a bit line precharge potential VBL=GND. When signal BLEQ attains the active level or the "H" level, N-channel MOS transistors 111 to 113 are rendered conductive, and bit lines BL, /BL are equalized to a bit line potential VBL.

Equalizer 114 includes three N-channel MOS transistors 115 to 117. N-channel MOS transistor 115 is connected between the corresponding bit lines BL and lBL of memory array block MAk. N-channel MOS transistors 116 and 117 are respectively connected between the corresponding bit lines BL, /BL and a node N10. Gates of N-channel MOS transistors 115 to 117 are all connected to a node N9. Node N9 receives bit line equalize signal BLEQ, and node N10 receives bit line precharge potential VBL=GND. When signal BLEQ attains the active level or the "H" level, N-channel MOS transistors 115 to 117 are rendered conductive, and bit lines BL, /BL are equalized to bit line precharge potential VBL.

Figure 25:
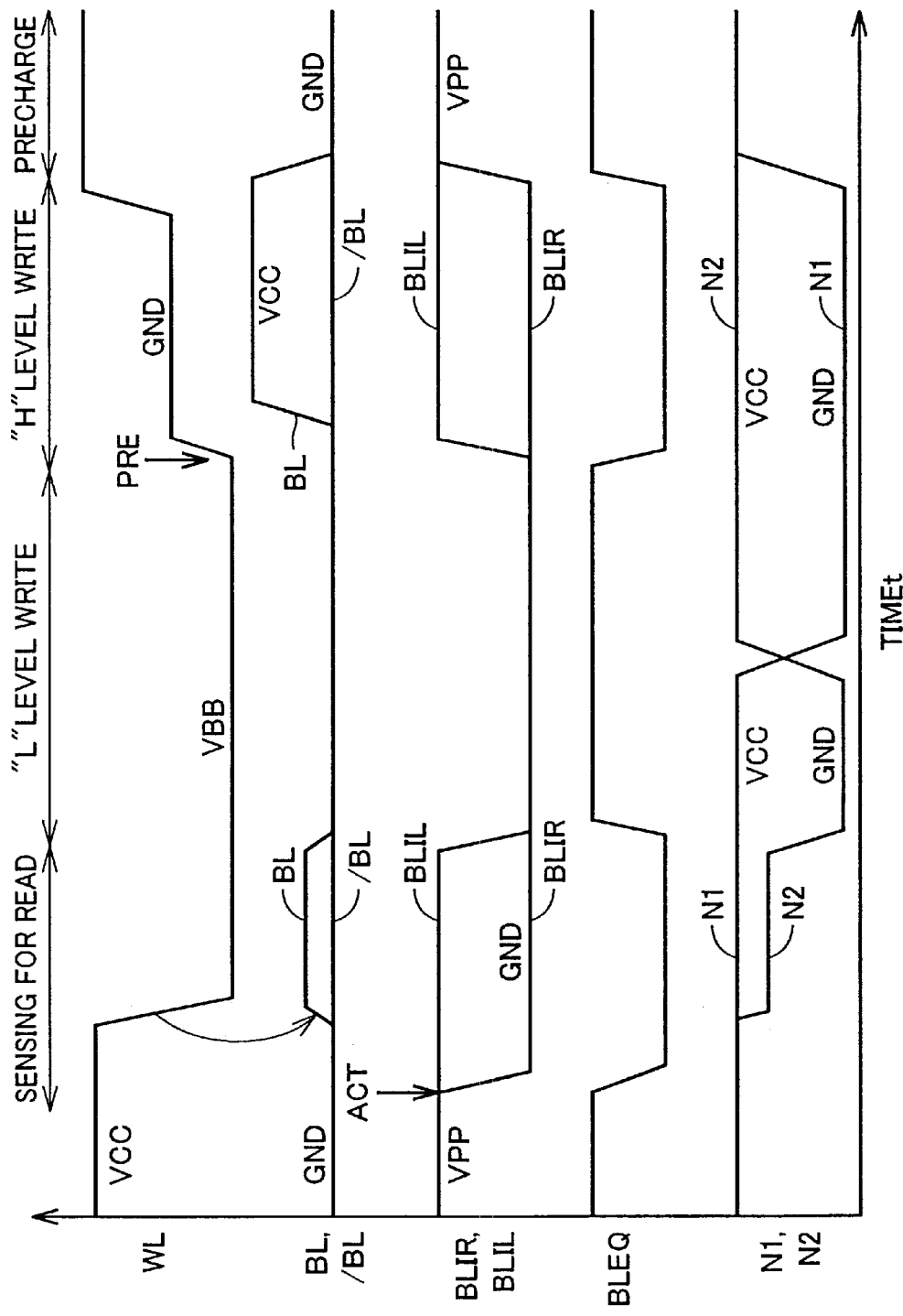
FIG. 25 is a timing chart showing a method of data write of the memory circuit portion shown in FIG. 24.

FIG. 25 is a timing chart showing a method of data write of the memory circuit portion described in relation to FIG. 24. In FIG. 25, in a standby state, word line WL is at power-supply potential VCC, and P-channel MOS transistors Q' of two memory cells MC' of FIG. 24 are both non-conductive. Power-supply potential VCC is written in one of the two memory cells MC', and the other memory cell MC' maintains ground potential GND. In addition, signals BLIR, BLIL are both at boosted potential VPP, and transfer gates 90 and 93 are both conductive. Moreover, signal BLEQ is at the "H" level, and bit lines BL, /BL are equalized to bit line precharge potential VBL=GND by equalizers 111 and 114.

When at a certain point in time, an active command ACT is input and memory array block MAk is selected, for instance, signal BLIR falls to ground potential GND and transfer gate 90 is rendered non-conductive, and sense amplifier 27 is cut off from memory array block MAk−1. In addition, signal BLEQ attains the "L" level so that the equalizing operation of the potentials of bit lines BL, /BL is interrupted.

Then, word line WL of a row corresponding to row address signals RA0 to RAi falls to negative potential VBB. Consequently, P-channel MOS transistors Q' of the two memory cells MC' of FIG. 24 connected to that word line WL are rendered conductive, and a small potential difference corresponding to the stored data of the two memory cells MC' is generated between bit lines BL, /BL. At this time, for instance, it is assumed that the potential of bit line BL is slightly higher than the potential of bit line /BL.

Then, signals BLIL, BLIR both attain ground potential GND and transfer gates 90 and 93 are rendered non-conductive, and sense amplifier 27 is cut off from two memory array blocks MAk−1, MAk. In addition, signal BLEQ rises to the "H" level, and equalizers 110 and 114 are activated so that bit line pairs BL, /BL of memory array blocks MAk−1, MAk are equalized to bit line precharge potential VBL=GND. At this time, power-supply potential VCC is supplied to gates of N-channel MOS transistors 111 to 113 and 115 to 117 of equalizers 110 and 114, and negative potential VBB is applied to word line WL of FIG. 24 so that sufficient "L" level (ground potential GND) is supplied to storage nodes SN of two memory cells MC'.

Moreover, sense amplifier activating signals SE, /SE respectively attain the "H" level and the "L" level, thereby activating sense amplifier 27, and a small potential difference between nodes N1 and N2 is amplified to power-supply voltage VCC.

At this time, voltage Vgs applied to a gate insulating film of an P-channel MOS transistor Q' of a memory cell MC' is Vgs=VBB−GND so that no problem in reliability occurs even when the gate insulating film of P-channel MOS transistor Q' of memory cell MC' is made to have the same thin thickness as that of the insulating film of capacitor C.

Then, column select line CSL of a column corresponding to column address signals CA0 to CAi' rises to the select level or the "H" level, and column select gate 24 is rendered conductive. Thereafter, one data input/output line (for instance, /IO) of data input/output line pair IO, /IO attains the "H" level while the other data input/output line (IO in this case) attains the "L" level according to a write data signal. Accordingly, sense amplifier 27 causes node N2 to rise to power-supply potential VCC, and node N1 falls to ground potential GND.

When a precharge command PRE is input, word line WL rises from negative potential VBB to ground potential GND, while signal BLEQ falls to the "L" level, and equalizers 110 and 114 are rendered inactive. In addition, signal BLIL rises to boosted potential VPP, and transfer gate 93 is rendered conductive. Potentials GND, VCC of nodes N1 and N2 are respectively transmitted to bit lines BL, /BL of memory array block MAk, and are respectively written into storage nodes SN of two memory cells MC'. At this time, signal BLIL is at boosted potential VPP so that sufficient "H" level would be written into a storage node SN of one memory cell MC'. Moreover, at this time, voltage Vgs applied to a gate insulating film of a P-channel MOS transistor Q' of a memory cell MC' is Vgs=VCC so that there is no fear of dielectric breakdown taking place in the gate insulating film.

When the writing of the "H" level is completed, word line WL rises to power-supply potential VCC, and P-channel MOS transistors Q' of memory cells MC' are rendered non-conductive, and the levels of storage nodes SN are maintained. In addition, signals BLIR, BLIL both attain boosted potential VPP and transfer gates 90 and 93 are rendered conductive, and signals SE, /SE attain the bit line precharge potential level of VCC/2 so that sense amplifier 27 is rendered inactive. Signal BLEQ attains the "H" level, and bit lines BL, /BL are equalized to bit line precharge potential VBL.

According to the fourth embodiment, first, word line WL is caused to attain negative potential VBB and data of the "L" level is written into one memory cell MC', and then, word line WL is caused to attain ground potential GND and data of the "H" level is written into the other memory cell MC'. Thus, voltage Vgs applied to a gate insulating film of P-channel MOS transistor Q' of memory cell MC' can be made to be VCC or below, and the gate insulating film of P-channel MOS transistor Q' of memory cell MC' can be made to have the same thin thickness as that of the insulating film of capacitor C, which ultimately allows a memory cell MC' of a small size to be configured. In addition, the "H" level or the "L" level can be sufficiently written into a storage node SN of memory cell MC.

Moreover, the fourth embodiment is applied to a mode in which a data signal of one bit is stored using two memory cells MC' and the two memory cells MC' are connected to one word line WL. Needless to say, however, this method of data write is also applicable to a mode in which one bit of data is stored using one memory cell MC', and as shown in FIG. 8, it can also be applied to a mode in which a data signal of one bit is stored using two memory cells MC' and the two memory cells MC' are respectively connected to two word lines WL.

Fifth Embodiment

Figure 26:
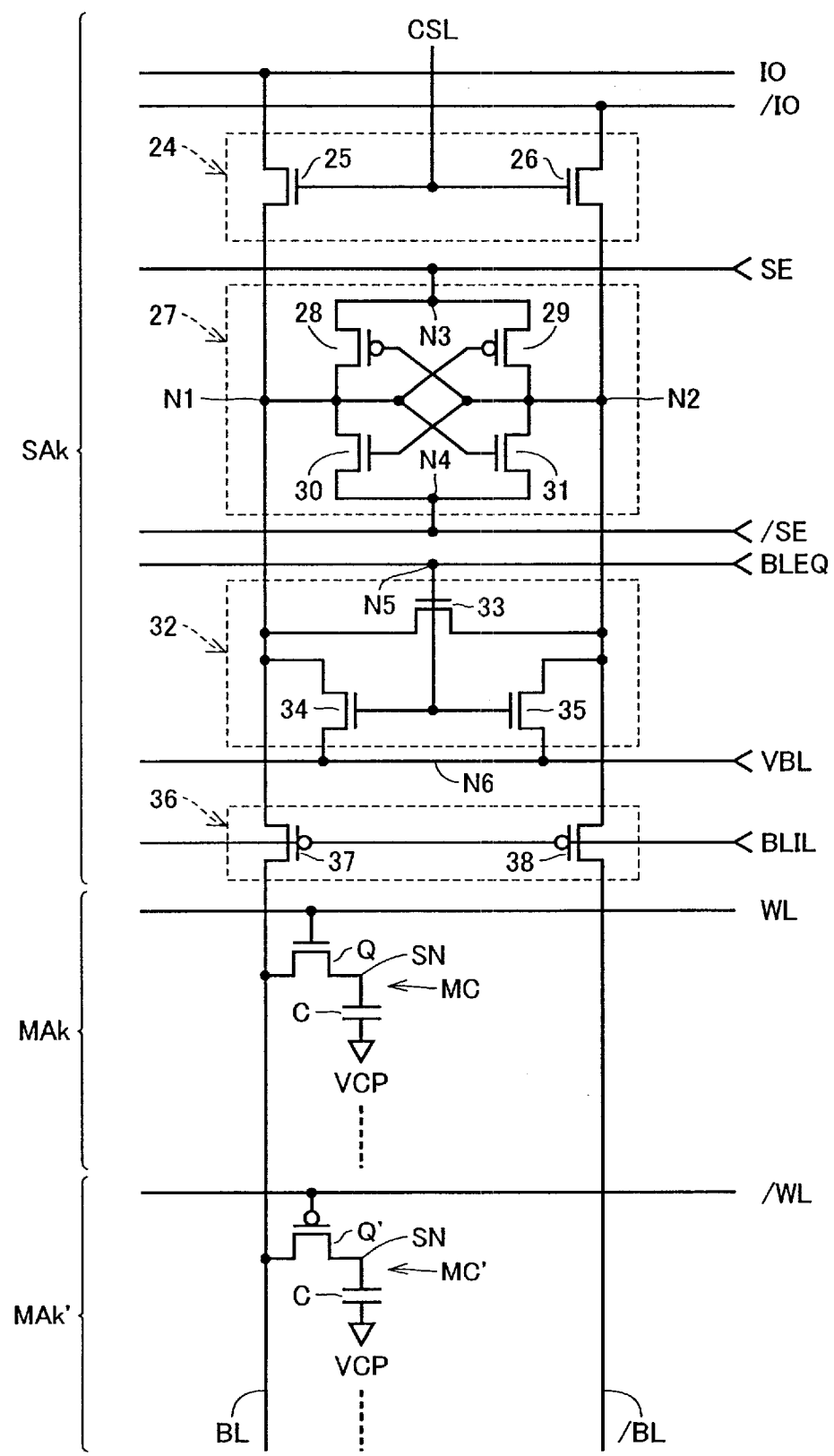
FIG. 26 is a circuit diagram representing the main portion of a memory circuit portion of a system LSI according to a fifth embodiment of the present invention.

FIG. 26 is a circuit diagram representing the main portion of a memory circuit portion of a system LSI according to the fifth embodiment of the present invention, and is used in comparison with FIG. 5. As shown in FIG. 26, this memory circuit portion differs from the memory circuit portion of FIG. 5 in that a memory array block MA' adjacent to memory array block MA is additionally provided. FIG. 26 shows a memory array block MAk' adjacent to memory array block MAk.

Memory array block MAk' includes a plurality of memory cells MC' arranged in a matrix of rows and columns having the same number of rows and columns as memory array block MAk, a word line /WL provided corresponding to each row, and bit line pair BL, /BL provided corresponding to each column. A memory cell MC' has a P-channel MOS transistor Q' replacing N-channel MOS transistor Q of memory cell MC. A plurality of word lines /WL of memory array block MAk' are respectively provided corresponding to a plurality of word lines WL of memory array block MAk. A word line WL and a corresponding word line /WL forms a pair, and when word line WL attains the select level or the "H" level (power-supply voltage VCC), the corresponding word line /WL attains the select level or the "L" level (ground potential GND). Bit lines BL, /BL of memory array block MAk and bit lines BL, /BL of memory array block MAk' are connected. The active level of signals BLIR, BLIL is negative potential VBB, while their inactive level is power-supply potential VCC.

Now, let us assume that memory array blocks MAk and MAk' are selected and signal BLIL is at the active level or negative potential VBB. During a write mode, one pair of word lines WL, /WL designated by row address signals RA0 to RAi respectively attain power-supply potential VCC and ground potential GND, and N-channel MOS transistor Q of memory cell MC and P-channel MOS transistor Q' of memory cell MC' corresponding to these word lines WL, /WL are rendered conductive. Thereafter, one of bit lines BL, /BL attains power-supply potential VCC while the other bit line attains ground potential GND according to a write data signal.

When bit line BL attains power-supply potential VCC, a sufficient "H" level (power-supply potential VCC) is written into storage node SN of memory cell MC', while VCC−Vtn is written into storage node SN of memory cell MC. When bit line BL attains ground potential GND, a sufficient "L" level (ground potential GND) is written into storage node SN of memory cell MC, while |Vtp| is written into storage node SN of memory cell MC'.

During a read mode, in a case where the "H" level is written into memory cells MC and MC', when word lines WL, /WL respectively attain power-supply potential VCC and ground potential GND, P-channel MOS transistor Q' of memory cell MC' is sufficiently rendered conductive and data of the "H" level is sufficiently read from memory cell MC', while N-channel MOS transistor Q of memory cell MC is not sufficiently rendered conductive and data of the "H" level is not read sufficiently from memory cell MC.

In addition, in a case where the "L" level is written into memory cells MC, MC', when word lines WL, /WL respectively attain power-supply potential VCC and ground potential GND, N-channel MOS transistor Q of memory cell MC is sufficiently rendered conductive and data of the "L" level is read sufficiently from memory cell MC, while P-channel MOS transistor Q' of memory cell MC' is not sufficiently rendered conductive and data of the "L" level is not read sufficiently from memory cell MC'.

According to the fifth embodiment, the read/write operation of the data of the "L" level is performed using memory cell MC, while the read/write operation of the data of the "H" level is performed using memory cell MC' so that the read/write operation of data can be sufficiently performed even when an amplitude voltage of word lines WL, /WL is power-supply voltage VCC. Thus, the gate insulating films of N-channel MOS transistor Q and P-channel MOS transistor Q' of memory cells MC and MC' can be made to have the same thin thickness as that of an insulating film of capacitor C, and memory cells MC, MC' of small size can be configured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate, comprising:

a memory cell having an MOS transistor and a capacitor connected in series for storing a data signal, wherein
said MOS transistor includes a gate insulating film formed on a surface of said semiconductor substrate, a gate electrode formed on a surface of the gate insulating film, and an impurity diffusion region formed on the surface of said semiconductor substrate on either side of the gate electrode,
said capacitor includes an impurity diffusion region formed on the surface of said semiconductor substrate, an insulating film formed on a surface of the impurity diffusion region, and a plate electrode formed on a surface of the insulating film for receiving a reference potential, and
the gate electrode of said MOS transistor and the plate electrode of said capacitor are formed by a same interconnection layer.

2. The semiconductor memory device according to claim 1, wherein
said semiconductor memory device is formed on said semiconductor substrate together with a logic circuit including an MOS transistor, and a gate electrode of the MOS transistor of said logic circuit, the gate electrode of the MOS transistor of said memory cell, and the plate electrode of said capacitor are formed by the same interconnection layer.

3. The semiconductor memory device according to claim 1, wherein the MOS transistor of said memory cell is an N-channel MOS transistor, said semiconductor memory device further comprising:

a word line connected to a gate of said N-channel MOS transistor;

first and second bit lines, one of which is connected to a source of said N-channel MOS transistor;

a first P-channel MOS transistor connected between said first bit line and a first node;

a second P-channel MOS transistor connected between said second bit line and a second node; and a write circuit for writing a data signal into said memory cell, wherein said write circuit performs the steps of:

supplying a ground potential to gates of said first and second P-channel MOS transistors to render said first and second P-channel MOS transistors conductive;

supplying a boosted potential that is higher than a power-supply potential to said word line to render the N-channel MOS transistor of said memory cell conductive;

causing one of said first and second nodes to attain said power-supply potential while causing other node to attain said ground potential according to an externally supplied write data signal; and supplying a negative potential that is lower than said ground potential to gates of said first and second P-channel MOS transistors while supplying said power-supply potential to said word line.

4. The semiconductor memory device according to claim 3, wherein an absolute value of a threshold voltage of each of said first and second P-channel MOS transistors is set to be substantially equal to a voltage of a difference between said boosted potential and said power-supply potential.

5. The semiconductor memory device according to claim 3, wherein two memory cells are provided, and one data signal is stored using said two memory cells, two word lines are provided, gates of N-channel MOS transistors of said two memory cells are respectively connected to said two word lines, and sources of the N-channel MOS transistors of said two memory cells are respectively connected to said first and second bit lines.

6. The semiconductor memory device according to claim 3, wherein two memory cells are provided, and one data signal is stored using said two memory cells, gates of N-channel MOS transistors of said two memory cells are both connected to said word line, and sources of the N-channel MOS transistors of said two memory cells are respectively connected to said first and second bit lines.

7. The semiconductor memory device according to claim 1, wherein the MOS transistor of said memory cell is a P-channel MOS transistor, said semiconductor memory device further comprising:

a word line connected to a gate of said P-channel MOS transistor;

first and second bit lines, one of which is connected to a source of said P-channel MOS transistor;

a first N-channel MOS transistor connected between said first bit line and a first node;

a second N-channel MOS transistor connected between said second bit line and a second node; and a write circuit for writing a data signal into said memory cell, wherein said write circuit performs the steps of:

supplying a power-supply potential to gates of said first and second N-channel MOS transistors to render said first and second N-channel MOS transistors conductive;

supplying a negative potential that is lower than a ground potential to said word line to render the P-channel MOS transistor of said memory cell conductive;

causing one of said first and second nodes to attain said power-supply potential while causing other node to attain said ground potential according to an externally supplied write data signal; and supplying a boosted potential that is higher than said power-supply potential to gates of said first and second N-channel MOS transistors while supplying said ground potential to said word line.

8. The semiconductor memory device according to claim 7, wherein a threshold voltage of said first and second N-channel MOS transistors is set to be substantially equal to a voltage of a difference between said ground potential and said negative potential.

9. The semiconductor memory device according to claim 7, wherein two memory cells are provided, and one data signal is stored using said two memory cells, two word lines are provided, gates of P-channel MOS transistors of said two memory cells are respectively connected to said two word lines, and sources of the P-channel MOS transistors of said two memory cells are respectively connected to said first and second bit lines.

10. The semiconductor memory device according to claim 7, wherein two memory cells are provided, and one data signal is stored using said two memory cells, gates of P-channel MOS transistors of said two memory cells are both connected to said word line, and sources of the P-channel MOS transistors of said two memory cells are respectively connected to said first and second bit lines.

11. The semiconductor memory device according to claim 1, wherein the MOS transistor of said memory cell is an N-channel MOS transistor, said semiconductor memory device further comprising:

a word line connected to a gate of said N-channel MOS transistor;

first and second bit lines, one of which is connected to a source of said N-channel MOS transistor; and a write circuit for writing a data signal into said memory cell, wherein said write circuit performs the steps of:
supplying a boosted potential that is higher than a power-supply potential to said word line to render the N-channel MOS transistor of said memory cell conductive;
supplying said power-supply potential to said first and second bit lines;
supplying said power-supply potential to said word line; and
causing one of said first and second bit lines to attain said power-supply potential while causing other bit line to attain a ground potential according to an externally supplied write data signal.

12. The semiconductor memory device according to claim 11, wherein
two memory cells are provided, and one data signal is stored using said two memory cells,
two word lines are provided,
gates of N-channel MOS transistors of said two memory cells are respectively connected to said two word lines, and
sources of the N-channel MOS transistors of said two memory cells are respectively connected to said first and second bit lines.

13. The semiconductor memory device according to claim 11, wherein
two memory cells are provided, and one data signal is stored using said two memory cells,
gates of N-channel MOS transistors of said two memory cells are both connected to said word line, and
sources of the N-channel MOS transistors of said two memory cells are respectively connected to said first and second bit lines.

14. The semiconductor memory device according to claim 1, wherein
the MOS transistor of said memory cell is a P-channel MOS transistor, said semiconductor memory device further comprising:
a word line connected to a gate of said P-channel MOS transistor;
first and second bit lines, one of which is connected to a source of said P-channel MOS transistor; and
a write circuit for writing a data signal into said memory cell, wherein
said write circuit performs the steps of:
supplying a negative potential that is lower than a ground potential to said word line to render the N-channel MOS transistor of said memory cell conductive;
supplying said ground potential to said first and second bit lines;
supplying said ground potential to said word line; and
causing one of said first and second bit lines to attain a power-supply potential while causing other bit line to attain said ground potential according to an externally supplied write data signal.

15. The semiconductor memory device according to claim 14, wherein
two memory cells are provided, and one data signal is stored using said two memory cells,
two word lines are provided,
gates of P-channel MOS transistors of said two memory cells are respectively connected to said two word lines, and
sources of the P-channel MOS transistors of said two memory cells are respectively connected to said first and second bit lines.

16. The semiconductor memory device according to claim 14, wherein
two memory cells are provided, and one data signal is stored using said two memory cells,
gates of P-channel MOS transistors of said two memory cells are both connected to said word line, and
sources of the P-channel MOS transistors of said two memory cells are respectively connected to said first and second bit lines.

17. The semiconductor memory device according to claim 1, wherein
two memory cells are provided, and one data signal is stored using said two memory cells, and
an MOS transistor of one of said two memory cells is an N-channel MOS transistor, and an MOS transistor of other memory cell is a P-channel MOS transistor, said semiconductor memory device further comprising:
first and second word lines respectively connected to a gate of said N-channel MOS transistor and a gate of said P-channel MOS transistor;
first and second bit lines, one of which is connected to a source of said N-channel MOS transistor and a source of said P-channel MOS transistor; and
a write circuit for writing a data signal into said two memory cells, wherein
said write circuit performs the steps of:
supplying a power-supply potential and a ground potential respectively to said first and second word lines to render conductive said N-channel MOS transistor and said P-channel MOS transistor; and
causing one of said first and second bit lines to attain said power-supply potential while causing other bit line to attain said ground potential according to an externally supplied write data signal.

* * * * *